US012727156B2

(12) United States Patent
Huang

(10) Patent No.: US 12,727,156 B2
(45) Date of Patent: Sep. 1, 2026

(54) SEMICONDUCTOR MEMORY STRUCTURE WITH SUPPORT FRAME IN STAIRCASE REGION AND METHOD OF MAKING THE SAME

(71) Applicant: ChangXin Memory Technologies, Inc., Hefei City (CN)

(72) Inventor: Meng Huang, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 461 days.

(21) Appl. No.: 18/547,316

(22) PCT Filed: Mar. 23, 2023

(86) PCT No.: PCT/CN2023/083452
§ 371 (c)(1),
(2) Date: Aug. 21, 2023

(87) PCT Pub. No.: WO2024/066247
PCT Pub. Date: Apr. 4, 2024

(65) Prior Publication Data

US 2025/0040131 A1 Jan. 30, 2025

(30) Foreign Application Priority Data

Sep. 28, 2022 (CN) ......................... 202211193866.X

(51) Int. Cl.
*H10B 12/00* (2023.01)

(52) U.S. Cl.
CPC ............. *H10B 12/50* (2023.02); *H10B 12/09* (2023.02); *H10B 12/315* (2023.02)

(58) Field of Classification Search
CPC ...... H10B 12/50; H10B 12/09; H10B 12/315; H10B 12/488; H10B 12/00; H10B 12/482; H10B 43/27
See application file for complete search history.

(56) References Cited

U.S. PATENT DOCUMENTS 11,152,391 B2 10/2021 Iguchi et al.
2019/0252386 A1* 8/2019 Lee ...................... H10D 62/822
2025/0071976 A1* 2/2025 Yang ...................... H10B 43/27

OTHER PUBLICATIONS

PCT/CN2023/083452 International Search Report and Written Opinion mailed Jun. 16, 2023.

* cited by examiner

*Primary Examiner* — John P. Dulka
(74) *Attorney, Agent, or Firm* — Syncoda LLC; Feng Ma

(57) ABSTRACT

A semiconductor structure and method of manufacturing are disclosed. The semiconductor structure includes: a substrate having an adjacent array area and a peripheral region; a bit line extending along a first direction, a semiconductor channel extending along a second direction and a word line extending along a third direction located on the array area; the ladder structure in the periphery region includes a plurality of steps each is in contact with either the bit line or the word line; a plurality of conductive columns in contact with the top surfaces of the steps and extending along the direction that is the same direction as the other one of the bit line or the word line; and a support frame located between any two adjacent conductive columns and connected to each step of the ladder structure.

17 Claims, 20 Drawing Sheets

SEMICONDUCTOR MEMORY STRUCTURE WITH SUPPORT FRAME IN STAIRCASE REGION AND METHOD OF MAKING THE SAME

CROSS REFERENCES TO RELATED APPLICATIONS

This application claims the benefit of priority of Chinese patent application filed on Sep. 28, 2022, entitled "SEMICONDUCTOR STRUCTURE AND METHOD MAKING THE SAME", with the application No. 202211193866.X, the contents of which are incorporated herein by reference in its entirety.

Technical Field

Embodiments of the present disclosure relate to the field of semiconductor technologies, and in particular, to semiconductor structures and their manufacturing methods thereof.

Background

In two-dimensional or planar semiconductor device, memory cells are arranged in a horizontal direction, therefore, the integration density of two-dimensional or planar semiconductor device can be determined by the area occupied by a memory cell unit of the two-dimensional or planar semiconductor device. The integration density is greatly affected by the fine pattern forming techniques, so that there is a limit to the continuous increase of the integration density of two-dimensional or planar semiconductor devices. Thus, there is a trend for the development of three-dimensional semiconductor devices.

Yet, the layout of the memory cells in the current three-dimensional semiconductor device and the connection mode of each functional device requires a brand-new design. For example, while saving the layout area of the semiconductor device, the leading out of the word lines or the bit lines in the semiconductor device for achieving the electrical connection to the peripheral logic circuit is an urgent problem to be considered. Moreover, in the process of using the electrical connection structure to lead out the word lines or the bit lines, the stability of the electrical connection structure and the electrical interference between adjacent electrical connection structures need to be considered.

SUMMARY

Embodiments of the present disclosure provide a semiconductor structure and a manufacturing method thereof, which are at least beneficial to improving the stability of the ladder structure and reducing electrical interference between adjacent steps and adjacent conductive columns.

According to some embodiments of the present disclosure, an embodiment of the present disclosure provides a semiconductor structure on the one hand, including: a substrate, the substrate has an array region and a peripheral region adjacent to the array region: bit lines extending in a first direction, semiconductor channels extending in a second direction, and word lines extending in a third direction; the first direction, the second direction, and the third direction intersect with one another: a ladder structure located on the peripheral region, which includes a plurality of steps, the steps are connected to one of the bit line and the word line one by one: columns, the extending direction of the conductive columns is the same as the extending direction of the other of the bit line and the word line: the support frame is located between any two adjacent conductive columns, and is connected to each of the steps in contact: wherein, along the extending direction of the conductive columns, the height of the top surface of any one step is different from that of the other step, and the adjacent steps are electrically insulated.

In some embodiments, along the extending direction of the conductive columns, the top surface of the support frame away from the substrate is the first top surface, and the farthest from the substrate in the ladder structure. The top surface of the step away from the substrate is the second top surface, the first top surface is not lower than the second top surface, and the bottom surface of the support frame close to the substrate is the first bottom surface, and the step at the bottom surface of the step closest to the substrate in the structure is the second bottom surface, and the first bottom surface is not higher than the second bottom surface.

In some embodiments, the steps are arranged in an array along the first direction and the second direction.

In some embodiments, along the direction from the array area to the peripheral region, the heights of the top surfaces of the several steps arranged at intervals along the first direction gradually decrease, and along the direction of the second heights of the top surfaces of the several steps arranged at intervals in the two directions also gradually decrease.

In some embodiments, the support frame includes a plurality of support layers, any one of the support layers is in contact with at least two of the steps, and a plurality of the steps are respectively located on the opposite sides of the support layer in the first direction and/or opposite sides of the support layer in the second direction.

In some embodiments, the step is connected to the bit line one by one: the support frame includes: a first support layer extending in one of the first direction and the second direction and second support layer arranged at intervals along the other of the first direction and the second direction: wherein, the second support layer are located in the interval between adjacent first support layer.

In some embodiments, the extending direction of the first support layer is a reference direction, and a plurality of steps arranged at intervals along the reference direction are all in contact with the first support layer.

In some embodiments, the extending direction of the first support layer is a reference direction, and a plurality of the first support layer are arranged at intervals along the reference direction, and are arranged at intervals along the reference direction, the plurality of steps are respectively in contact with the plurality of first support layer.

In some embodiments, the step is connected to the bit line one by one: the support frame includes: a first support layer extending along the first direction and the second direction, located adjacent to the second support layer in the interval between the first support layer: wherein, the first support layer is in contact with the four steps arranged in an array, and the first support layer is arranged at intervals along the first direction and/or the second direction, and the second support layer is in contact with the four steps arranged in an array.

In some embodiments, the support frame is a grid structure, and the grid structure has a plurality of spaces, and the steps are located in the spaces and correspond to the spaces one by one.

In some embodiments, the material of the support frame includes at least one of silicon nitride or silicon oxynitride.

In some embodiments, the peripheral region includes a spacer region between the ladder structure and the array region, the bit line or the word line is also located in the spacer region, and the semiconductor structure also includes: a peripheral protection layer, the peripheral protection layer is located on the spacer and surrounds the sidewall of the bit line or the word line of the spacer extending along the first direction.

In some embodiments, the peripheral protective layer surrounds the sidewalls of the ladder structure extending along the extending direction of the conductive columns, and there is a space between part of the peripheral protective layer and the ladder structure.

In some embodiments, the material of the outer protective layer is the same as the material of the support frame.

According to some embodiments of the present disclosure, on the other hand, the embodiments of the present disclosure also provide a method for manufacturing a semiconductor structure, including: providing a substrate, the substrate having an array region and a peripheral region adjacent to the array region: forming bit lines extending along a first direction, semiconductor channels extending along a second direction, and word lines extending along a third direction, wherein the first direction, the second direction, and the third direction are intersected with one another: a ladder structure, a conductive column and a support frame are formed on the peripheral region, wherein the ladder structure includes a plurality of steps, and the steps are in contact with either of the bit lines or the word lines in a one-to-one manner: the conductive columns are connected to the steps one by one, and the extending direction of the conductive columns is the same as the extending direction of the other of the bit lines or the word lines: the support frame is located between any adjacent two conductive columns, and in contact with each of the steps: along the extending direction of the conductive columns, the height of the top surface of any one of the steps is different from that of the other steps, and adjacent steps are electrical insulated.

In some embodiments, the step of forming the ladder structure includes: forming a multi-layer initial stacked structure stacked along the extending direction of the conductive columns on the peripheral region: in the extending direction of the conductive columns, the initial stacked structure includes a stacked first semiconductor layer and a second semiconductor layer, the initial stacked structure has a spacing area close to the array area and a step area located on the side of the spacing area away from the array area: performing a first patterning process on the initial stacked structure of the step area to form an initial ladder structure, the initial ladder structure includes a plurality of initial ladder structures, along the extending direction of the conductive columns, any of the height of the top surface of the initial ladder structure is different from the height of the top surface of another said initial ladder structure; said initial ladder structure is etched to form a space in which said step is formed.

In some embodiments, after forming the initial ladder structure, before etching the initial ladder structure to form the step, the step of forming the support frame includes: forming a first dielectric layer, the first dielectric layer is located on the top surface of each initial ladder structure, the top surface of the initial ladder structure farthest from the substrate is the reference top surface, and the first dielectric layer is far away from the top surface of the substrate and the top surface of the substrate. The reference top surface is flush: a second patterning process is performed on the initial ladder structure and the first dielectric layer to form a first groove: and the support frame filling the first groove is formed.

In some embodiments, the first dielectric layer is also located on opposite sides of the initial ladder structure along the second direction: after forming the initial ladder structure, etching the initial step Before forming the step, it also includes: performing a third patterning process on the initial stack structure and the first dielectric layer in the spacing area to form a second groove: the outer protective layer of the groove.

In some embodiments, after forming the peripheral protective layer, etching the initial ladder structure to form a spacer includes: removing the initial ladder structure and the peripheral protective layer. the first dielectric layer to expose the opposite sides of the initial ladder structure along the second direction: along the second direction, etching the second semiconductor layer in the initial ladder structure. to form the interval: and form the step filling the interval.

In some embodiments, after forming the step, further comprising: etching the first semiconductor layer in the initial ladder structure along the second direction to form a gap: forming a second a dielectric layer, the second dielectric layer fills up the gap, and fills up the space between the peripheral protection layer and the ladder structure.

BRIEF DESCRIPTION OF THE DRAWINGS

One or more embodiments are illustrated by corresponding figures in the accompanying drawings, and these exemplary illustrations do not constitute a limitation to the embodiments. Unless otherwise specified, the figures in the accompanying drawings do not constitute scale restrictions. In order to illustrate the technical solutions in the embodiments of the present disclosure or the conventional technologies more clearly, the following will briefly introduce the accompanying drawings that need to be used in the embodiments. Obviously, the accompanying drawings in the following description are only the disclosure of the present disclosure. For some embodiments, those of ordinary skill in the art can also obtain other drawings based on these drawings without creative efforts.

DETAILED DESCRIPTION OF THE PREFERRED EMBODIMENTS

It can be seen from the background technology that the word line or bit line is led out by using the electrical connection structure to electrically connect with the peripheral logic circuit, the stability of the electrical connection structure needs to be improved, and the electrical interference between adjacent electrical connection structures needs to be lowered.

The present disclosure provides a semiconductor structure and a manufacturing method thereof. In the semiconductor structure, word lines or bit lines in the array area are led out to the peripheral region by using a ladder structure to connect to peripheral control circuits. Wherein, the steps in the ladder structure are in contact with the word lines in a one-by-one manner, or the steps in the ladder structure are in contact with the bit lines in a one-to-one manner, so as to lead out the word lines or the bit lines through the steps. Further, the conductive columns and the steps are in a one-to-one contact for further leading out the word lines or the bit lines. Moreover, each of the support frames is located between any two adjacent conductive columns, and is in contact connection with each of the steps, so that it is beneficial for reducing the electrical interference between adjacent conductive columns, and the electrical interference between adjacent steps with the support frame, thus independent control of each word line or bit line is achieved. Beside, since the height of the top surface between the steps in the ladder structure is not the same, that is, the ladder irregularity of the structure itself is relatively high, the support frame is beneficial for improving the stability of the ladder structure, thereby improving the stability of the semiconductor structure.

Various embodiments of the present disclosure will be described in detail below in conjunction with the accompanying drawings. However, those of ordinary skill in the art can understand that, in each embodiment of the present disclosure, many technical details are provided to readers for a better understanding of the embodiments of the present disclosure. However, even without relying on these technical details or various changes and modifications based on the following embodiments are made, the technical solutions claimed in the embodiments of the present disclosure can still be realized.

Figure 1:
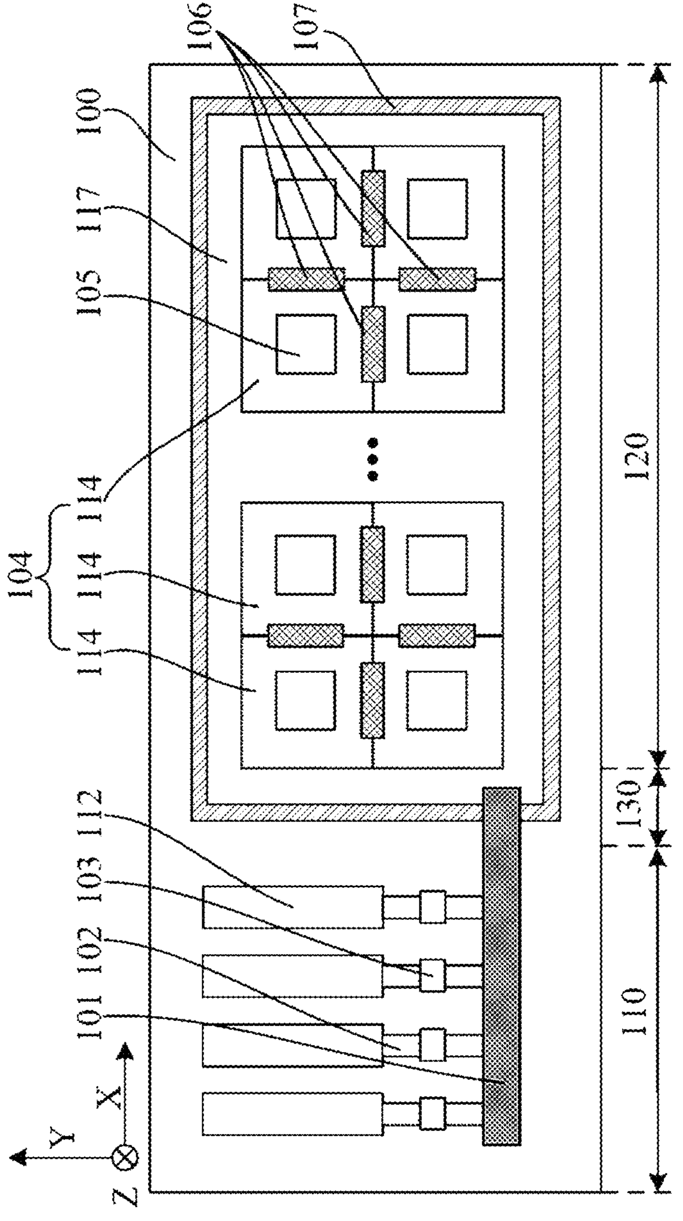
FIG. 1 and FIG. 2 are two kinds of top view structural schematic diagrams of a semiconductor structure provided by an embodiment of the present disclosure.
Figure 2:
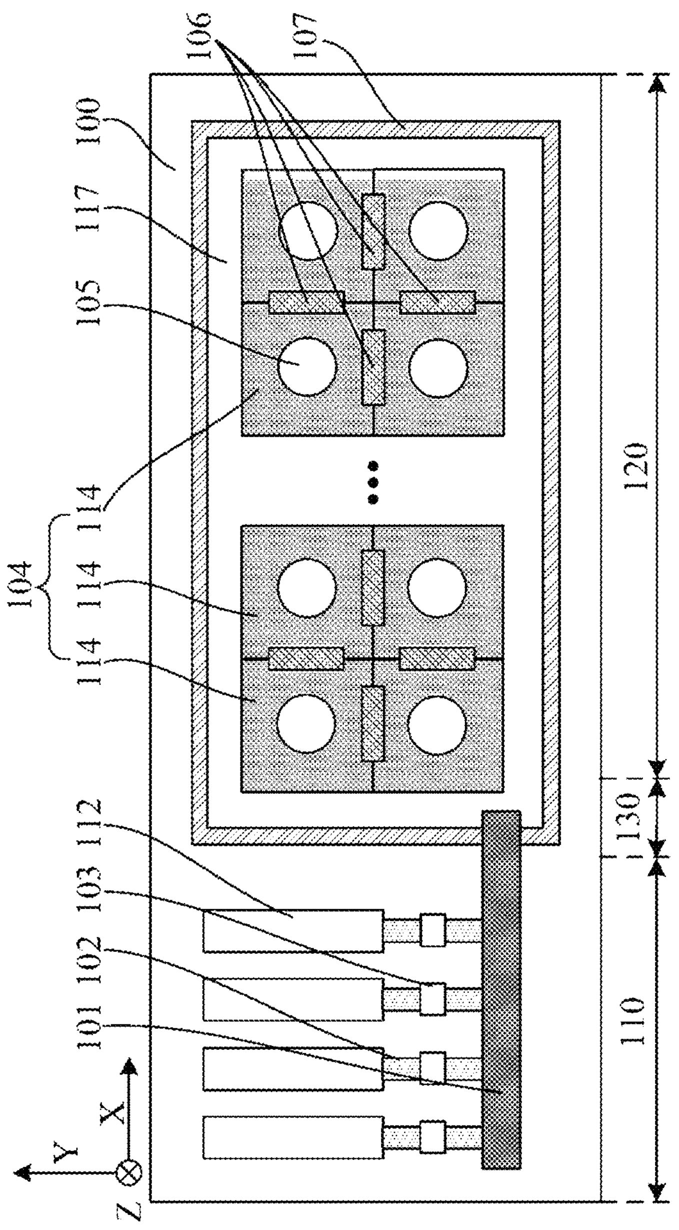
Figure 3:
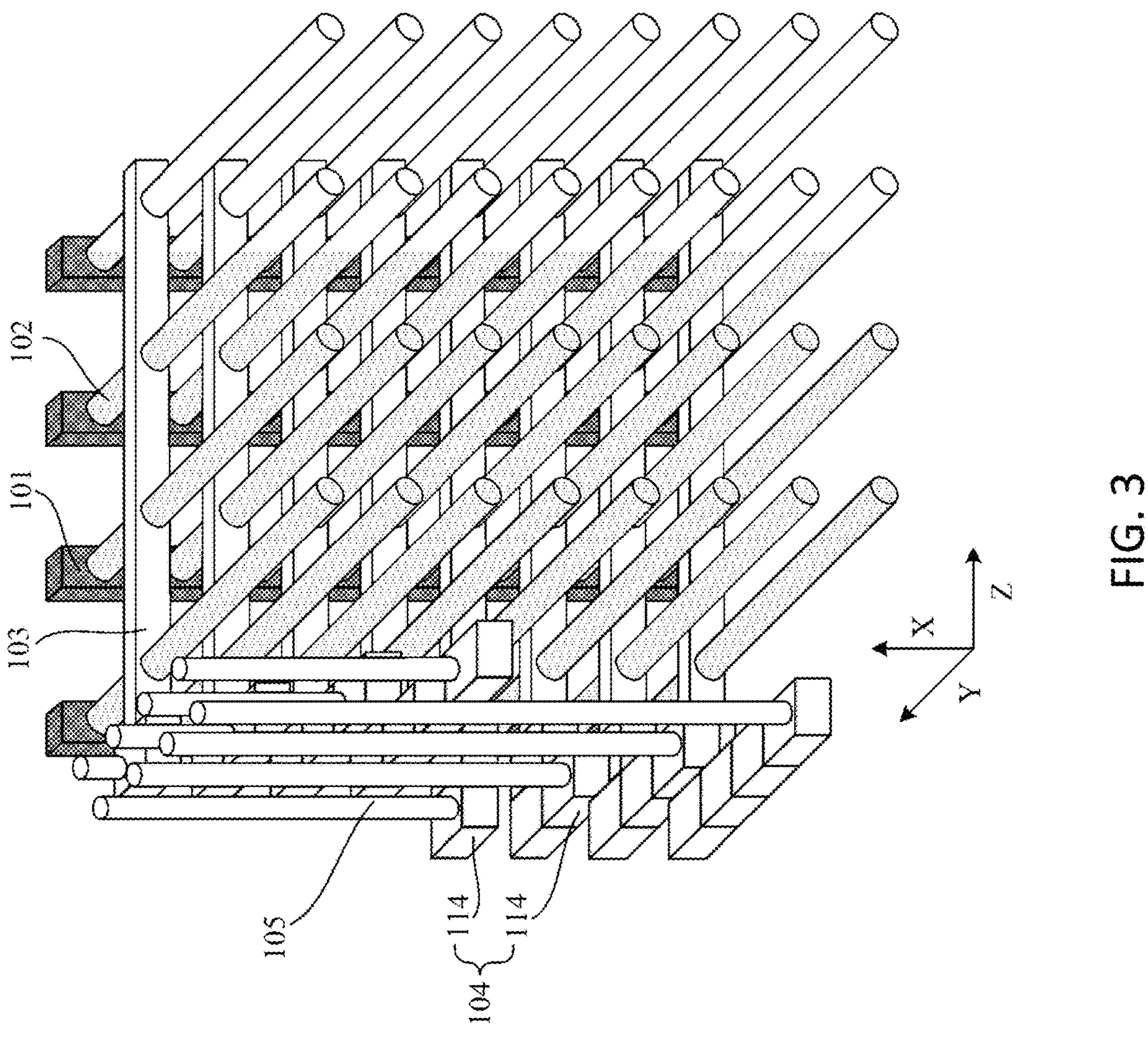
FIG. 3 is a schematic diagram of a partial three-dimensional structure of the semiconductor structure provided by an embodiment of the present disclosure.
Figure 4:
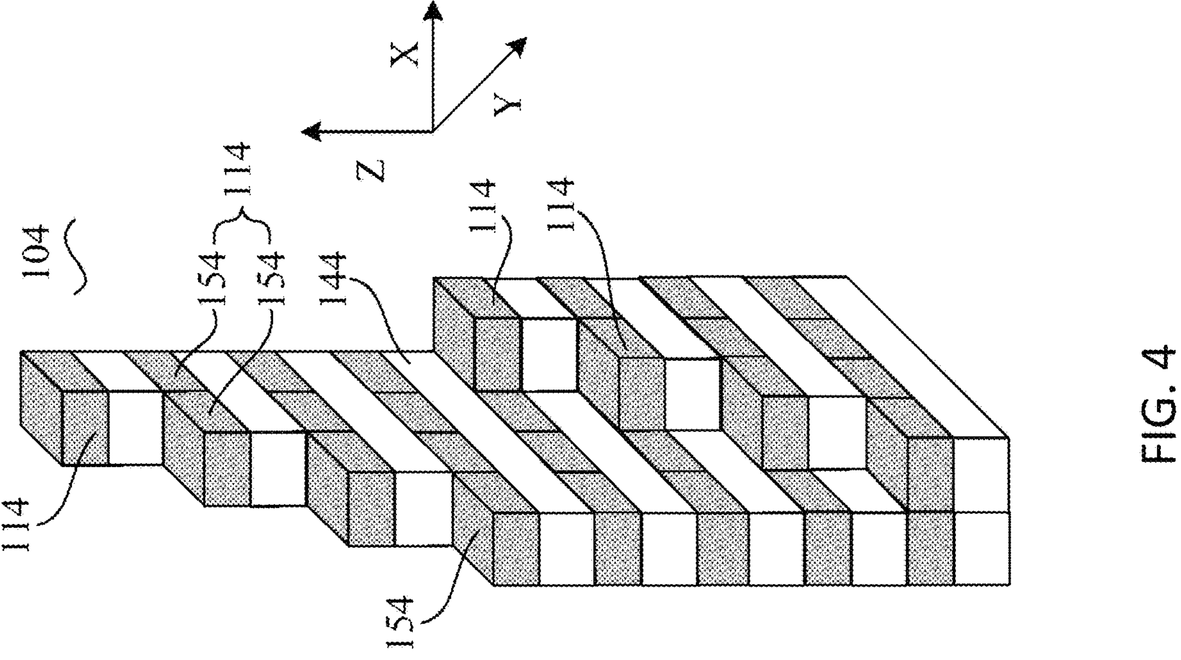
FIG. 4 is a schematic diagram of a three-dimensional structure of a ladder structure in a semiconductor structure provided by an embodiment of the present disclosure.
Figure 5:
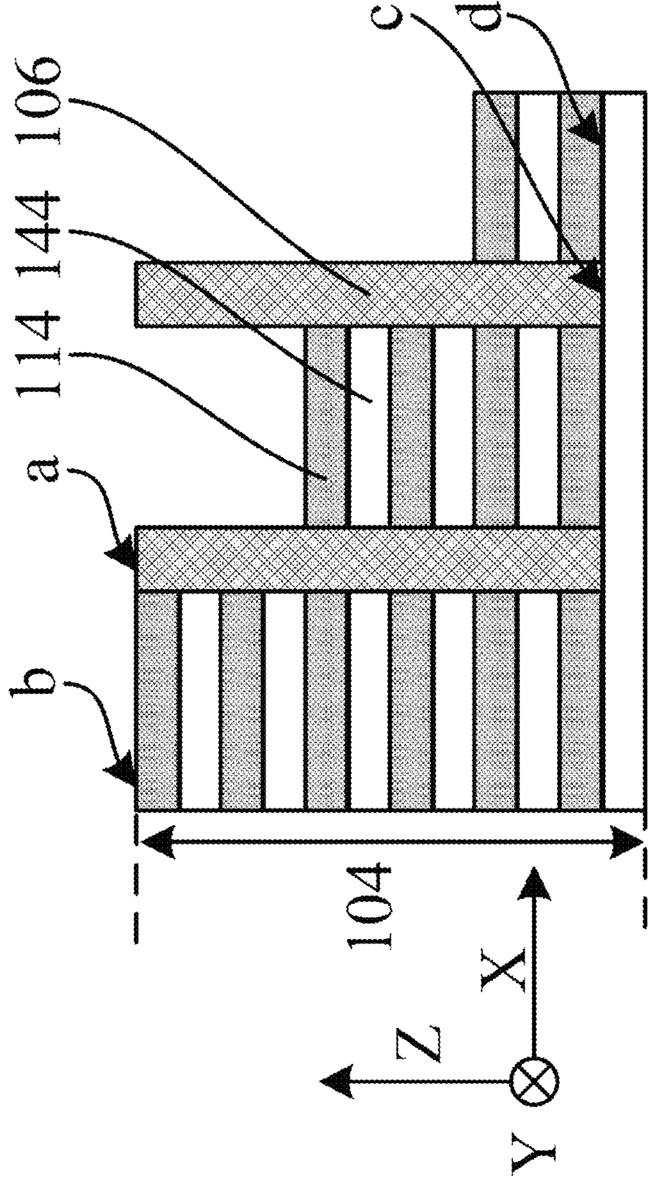
FIG. 5 is a partial cross-sectional structural schematic diagram of a ladder structure and a support frame in a semiconductor structure provided by an embodiment of the present disclosure.

An embodiment of the present disclosure provides a semiconductor structure, and the semiconductor structure provided by the embodiment of the present disclosure will be described in detail below with reference to the accompanying drawings. FIG. 1 and FIG. 2 are two top view structural diagrams of a semiconductor structure provided by an embodiment of the present disclosure. FIG. 3 is a schematic diagram of a partial three-dimensional structure of a semiconductor structure provided by an embodiment of the present disclosure. FIG. 4 is a schematic diagram of a three-dimensional structure of a ladder structure in a semiconductor structure provided in an embodiment of the disclosure. FIG. 5 is a schematic diagram of a partial cross-sectional structure of a ladder structure and a support frame in a semiconductor structure provided by an embodiment of the present disclosure. Five partial top view structural schematic diagrams of the semiconductor structure provided in the embodiment are illustrated in FIG. 6 to FIG. 10.

It should be noted that, in order to facilitate description and clearly illustrate the semiconductor structure, FIG. 1 to FIG. 10 in an embodiment of the present disclosure are partial structural schematic diagrams of the semiconductor structure.

Referring to FIG. 1 to FIG. 10, the semiconductor structure includes: a substrate 100, the substrate 100 has an array region 110 and a peripheral region 120 adjacent to the array region 110; bit lines 101 extending along a first direction X, semiconductor channels 102 extending along a second direction Y and word lines 103 extending in a third direction Z, the first direction X, the second direction Y and the third direction Z being intersected with one another: the ladder structure 104 located on the peripheral region 120, the ladder structure 104 including a plurality of steps 114, and each of the steps 114 is in contact with one of each of the bit lines 101 or the word lines 103 in a one-by-one manner: a plurality of conductive columns 105 connected to the top surface of the step 114 one by one, the extending direction of the conductive column 105 being same with the extending direction of the other one of the bit lines 101 or the word lines 103: the support frame 106 located between any two adjacent conductive columns 105, and in contact with each step 114. Wherein, along the extending direction of the conductive column 105, the height of the top surface of one step 114 is different from that of the other step 114 and each of the adjacent steps 114 are electrically insulated.

In some embodiments, the first direction X, the second direction Y and the third direction Z may be perpendicular to each other, in practical applications, provided that an included angle between any two of the first direction X, the second direction Y or the third direction Z is not 0° or 180°. For the convenience of description, the first direction X, the second direction Y and the third direction Z are perpendicular to each other as an example for detailed description as follows.

In some embodiments, referring to FIG. 1 and FIG. 2. a plurality of bit lines 101 may be arranged at intervals along the third direction Z, and the steps 114 are in contact with the bit lines 101 in a one-by-one manner, that is, the bit lines 101 are led out from the array area 110 to the peripheral region 120 by the ladder structure 104.

Wherein, the semiconductor structure may further include a capacitor structure 112. One of the two opposite ends of the semiconductor channel 102 in the second direction Y is in contact with the bit line 101, and the other end is in contact with the capacitor structure 112.

It should be noted that, in FIG. 1 and FIG. 2, the one of the bit lines 101 in connection with four semiconductor channels 102 is taken as an example. In practical applications, the quantity of semiconductor channels 102 connected with the same bit line 101 is not specified and the number of semiconductor channels 102 connected to the same word line 103 is not limited.

The specific structure of conductive column 105 at least includes following two kinds of embodiments:

In some embodiments, referring to FIG. 1, the cross-sectional shape of the conductive column 105 perpendicular to the third direction Z may be a square, that is, the conductive column 105 is a square column.

In other embodiments, referring to FIG. 2, the cross-sectional shape of the conductive column 105 perpendicular to the third direction Z may be circular, that is, the conductive column 105 is a cylindrical column.

In some other embodiments, referring to FIG. 3 and FIG. 4, a plurality of word lines 103 may be arranged at intervals along the first direction X, and each of the steps 114 is in contact with each of the word lines 103 in a one-by-one manner. That is, the word lines 103 are led out from the array area 110 to the peripheral region 120 through the ladder structure 104.

It should be noted that, in FIG. 3, eight word lines 103 arranged at intervals along the first direction X, and four bit lines 101 arranged at intervals along the third direction Z are taken as an example. In practical applications, there is no limit to the number of word lines 103 arranged at intervals along the first direction X, and there is no limit to the number of bit lines 101 arranged at intervals along the third direction Z. In addition, for ease of illustration, the differences between the steps 114 in the ladder structure 104 are fully shown, and the support frame is not shown in FIGS. 3 and 4.

In some embodiments, with reference to FIG. 4 and FIG. 5, along the third direction Z, there is a first interval between adjacent steps 114. The ladder structure 104 also includes several insulating layers 144. Each of the insulating layer 144 fills at least a first interval. In this way, the electrical insulation between different steps 114 is realized through the insulating layer 144. In addition, the insulating layer 144 is also located between the step 114 and the substrate 100 to realize electrical insulation between the step 114 and the substrate 100.

It should be understood that, referring to FIG. 1 to FIG. 3, the semiconductor channels 102 can be arranged at intervals along the first direction X and the third direction Z. The number of semiconductor channels 102 arranged at intervals along the first direction X is the same as that of the number of word lines 103 arranged at intervals along the first direction X. And the number of semiconductor channels 102 arranged at intervals along the third direction Z is the same as that of bit lines 101 arranged at intervals along the third direction Z.

It should be noted that, referring to FIGS. 1 to 3, the word line 103 may include a gate dielectric layer (not shown in the figure) and a gate (not shown in the figure). The gate dielectric layer surrounds parts of the semiconductor channel 102 sidewalls, and the gate dielectric layer corresponds to the semiconductor channel 102 one by one, and the gate extends along the third direction Z and surrounds the sidewall of the gate dielectric layer. Wherein, the gate dielectric layer is made of insulating material, and the gate is made of conductive material. In addition, for the convenience of the subsequent description, the leading out of the bit line 101 to the peripheral region 120 by the ladder structure 104 is taken as an example for detailed description.

The embodiments of the present disclosure will be described in more detailed below in conjunction with the accompanying drawings.

In some embodiments, referring to FIG. 5, along the extending direction of the conductive column 105, that is, in the third direction Z, the top surface of the support frame 106 away from the substrate 100 is the first top surface a. The top surface of the farthest step 114 of the substrate 100 away from the substrate 100 is the second top surface b, the first top surface a is not lower than the second top surface b, and the bottom surface of the support frame 106 close to the substrate 100 is the first bottom surface c, the bottom surface of the step 114 closest to the substrate 100 in the ladder structure 104 is the second bottom surface d, and the first bottom surface c is not higher than the second bottom surface d. In this way, the support frame 106 can be contacted with each step 114 to improve the stability of the ladder structure 104 and reduce the electrical interference between adjacent steps 114.

It should be noted that FIG. 5 can be a partial cross-sectional structural schematic diagram of the ladder structure 104 in FIG. 1 or FIG. 2, in FIG. 5 the first top surface a is flush with the second top surface b, the first bottom surface c and the second bottom surface d is flush as an example. In this way, the support frame 106 is in contact with the top surface of the insulating layer 144 closest to the substrate 100 in the ladder structure 104. In practical applications, the support frame 106 can run through the entire ladder along the third direction Z. The structure 104, that is, the support frame 106 can be embedded in the insulating layer 144 closest to the substrate 100, or the first top surface a of the support frame 106 can be higher than the second top surface b, so as to reduce the conductive current on the second top surface b. Electrical interference between columns 105 (see FIG. 1) and other conductive columns 105.

In some embodiments, referring to FIG. 4, the steps 114 may be arranged in an array along the first direction X and the second direction Y.

It can be understood that, in order to illustrate the difference between different steps 114 in the ladder structure 104, some steps 114 are divided into a plurality of sub-steps 154. Along the direction from the substrate 100 (refer to FIG. 1) to the bit line 101 (refer to FIG. 1), the semiconductor structure may sequentially include a first bit line, a second bit line, a third bit line, a fourth bit line, and a fifth bit line. the sixth bit line, the seventh bit line and the eighth bit line. Wherein, the step 114 provided on the same layer as the first bit line includes 1 sub-step 154; the step 114 provided on the same layer as the second bit line includes 2 sub-steps 154, and compared with the 1 sub-step corresponding to the first bit line 154 has one more sub-step 154 along the second direction Y, and the conductive column 105 corresponding to the second bit line is in contact with the extra sub-step 154; and so on, the step 114 set on the same layer as the fourth bit line includes 4 sub-steps 154, and compared with the 3 sub-steps 154 corresponding to the third bit line, there is one more sub-step 154 along the second direction Y, and the conductive column 105 corresponding to the fourth bit line and the extra sub-step 154 contact connections.

In addition, the step 114 provided on the same layer as the fifth bit line includes five sub-steps 154, one more sub-step 154 along the first direction X than the four sub-steps 154 corresponding to the fourth bit line. The conductive column 105 corresponding to the fifth bit line is in contact with the extra sub-step 154: and so on, the step 114 provided on the same layer as the eighth word line includes 8 sub-steps 154, and compared with that corresponding to the seventh bit line There is one more sub-step 154 along the first direction X from the seven sub-steps 154. and the conductive column 105 corresponding to the eighth bit line is in contact with the one more sub-step 154.

In this way, the trend that the overall step 114 is arranged in an array along the first direction X and the second direction Y is realized, and the height of the top surface of any step 114 is different from that of the other step 114 along the extending direction of the conductive column 105. The heights of the top surfaces are different, and the adjacent steps 114 are electrically insulated.

It should be noted that, in order to illustrate the difference between different steps 114 in the ladder structure 104, in FIG. 4, the number and arrangement of the sub-steps 154 contained in the steps 114 on different layers are different. In practical applications a single step 114 can be composed of a plurality of mutually independent sub-steps 154, that is, a plurality of sub-steps 154 is prepared separately, or a single step 114 itself has an integrated structure, and the sub-steps 154 are only for showing the difference between different steps 114. The feature defined by the difference is that the plurality of sub-steps 154 in a single step 114 form an integral structure.

In some embodiments, along the direction from the array region 110 to the peripheral region 120, that is, in the first direction X, the top surface heights of several steps 114 arranged at intervals along the first direction X gradually decrease, and along the heights of the top surfaces of the several steps 114 arranged at intervals in the second direction Y also gradually decrease.

In this way, on the one hand, the steps 114 are arranged in an array along the first direction X and the second direction Y: the top surfaces of the steps 114 are of different heights. It should be noted that the ladder structure 104 shown in FIG. There is no limit to the change trend, and it only needs to be satisfied that the height of the top surface of any step 114 is different from that of the other step 114.

In some embodiments, along the third direction Z, the height of the top surface of a step 114 is equal to the height of the top surface of the bit line 101, and the height of the bottom surface of the step 114 is equal to the height of the bottom surface of the bit line 101. flat. In this way, on the one hand, it is beneficial to make one end surface of the step 114 fully adhere to one end surface of the bit line 101, increase the contact area between the step 114 and the bit line 101, and reduce the contact resistance between the step 114 and the bit line 101. On the other hand, it is beneficial to improve the overall stability of the semiconductor structure.

It should be noted that the height of the top surface of the step 114 refers to the surface of the step 114 away from the side of the substrate 100, the height of the top surface of the bit line 101 refers to the surface of the side of the bit line 101 away from the substrate 100, and the step 114 height of the bottom of the step 114 refers to the surface of the step 114 near the substrate 100. and the height of the bottom of the bit line 101 refers to the surface of the bit line 101 near the substrate 100.

Figure 6:
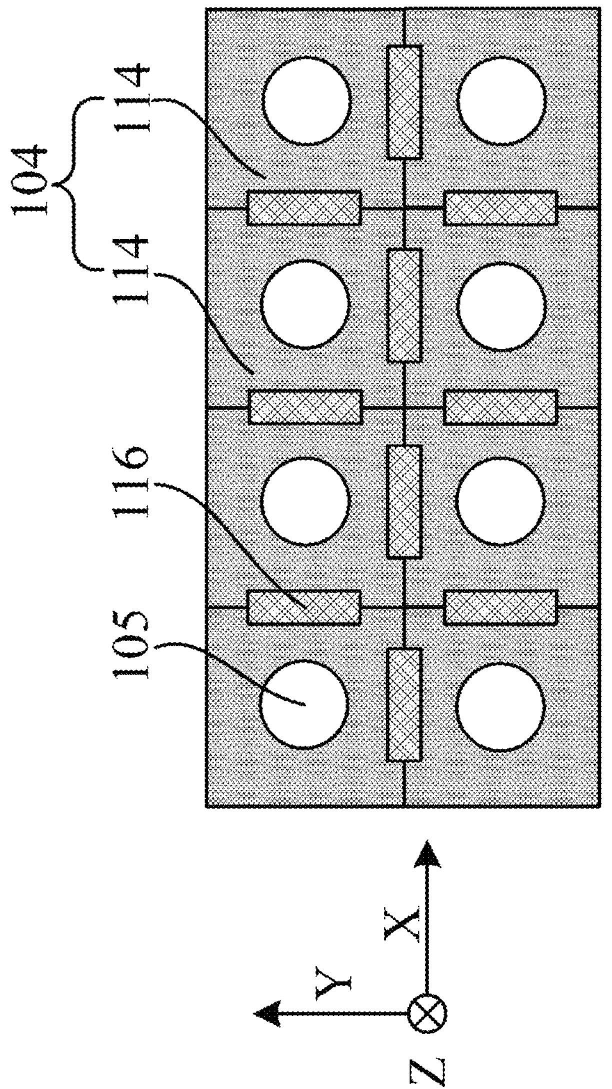
FIGS. 6 to 10 are schematic diagrams of five partial top view structures of a semiconductor structure provided by an embodiment of the present disclosure.

Support frame 106 comprises following five kinds of embodiments at least:

In some embodiments, with reference to FIG. 6, support frame 106 comprises multiple support layers 116, any support layer 116 is connected with at least two steps 114, and multiple steps 114 are respectively positioned at support layer 116 along the first opposite sides in the direction X and/or the support layer 116 are along the opposite sides in the second direction Y.

It can be understood that, for a certain step 114, when the step 114 is located on one of the opposite sides of a support layer 116 along the first direction X, the step 114 can also be located on another support layer 116 is along one of the two opposite sides in the second direction Y. In this way, for any two adjacent steps 114. there is a support layer 116 between the two steps 114. so as to realize electrical insulation between any two adjacent steps 114.

Figure 7:
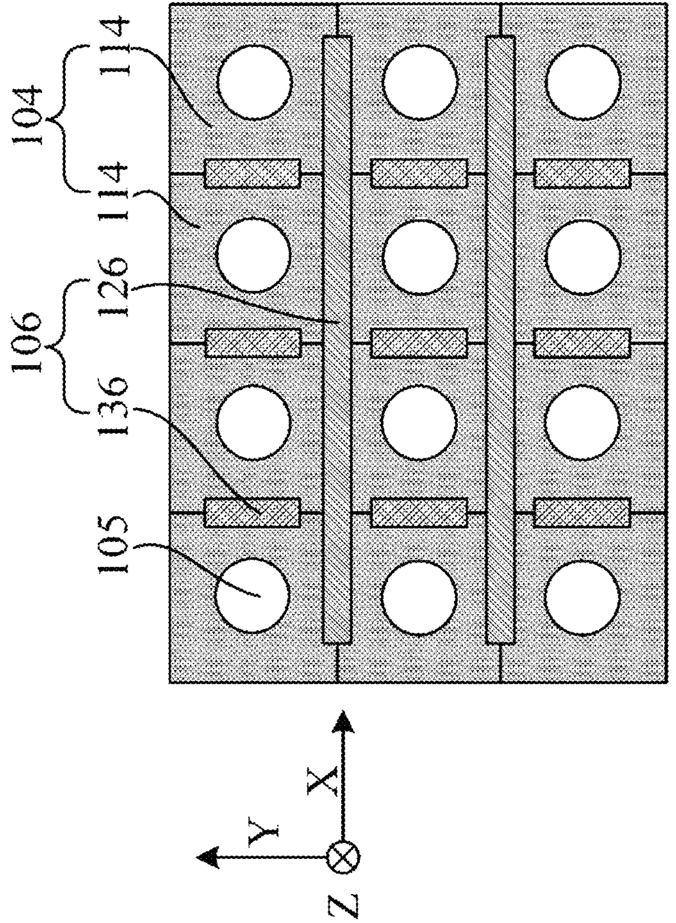
Figure 8:
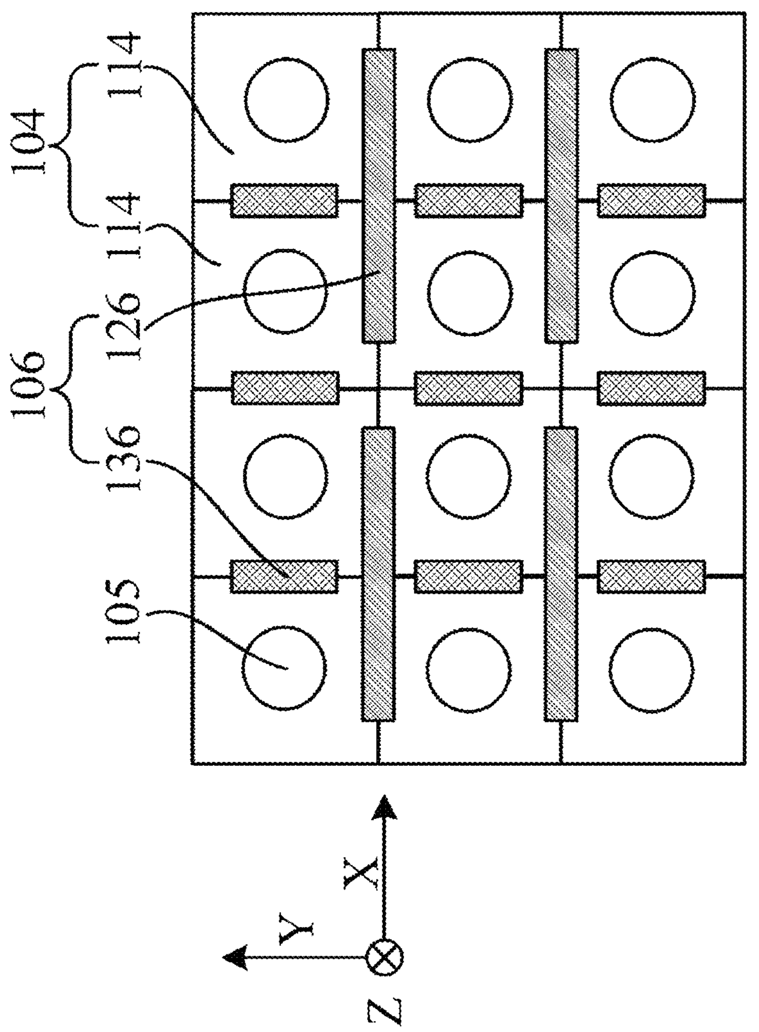

In some other embodiments, referring to FIG. 7 and FIG. 8, the step 114 is connected to the bit line 101 (refer to FIG. 2) one by one: the support frame 106 may include: along the first direction X and the second direction Y, the first support layer 126 extends in one direction, the second support layer 136 arranged at intervals along the other direction of the first direction X and the second direction Y: wherein, the second support layer 136 is located adjacent to the first support layer 126 intervals.

It should be noted that, in FIG. 7 and FIG. 8, the first support layer 126 extends along the first direction X, and the second support layer 136 extends along the second direction Y as an example, in practical applications, it may also be the first support layer 126 extends along the second direction Y, and the second support layer 136 extends along the first direction X.

The positional relationship between the first support layer 126 and the second support layer 136 will be described in detail below through two embodiments.

In some embodiments, with reference to FIG. 7, the extending direction of the first support layer 126 is the reference direction, i.e. the first direction X, and the plurality of steps 114 arranged at intervals along the reference direction are all aligned with the first support layer 126 contact connection. It can be understood that the plurality of first support layer 126 are only arranged at intervals along the second direction Y, and the second support layer 136 is in contact with two adjacent steps 114 along the first direction X.

In some other embodiments, referring to FIG. 8, the extending direction of the first support layer 126 is the reference direction, that is, the first direction X, and a plurality of first support layer 126 are arranged at intervals along the reference direction. A plurality of steps 114 arranged at intervals in the direction are respectively in contact with a plurality of first support layers 126. It can be understood that the plurality of first support layer 126 may be arranged at intervals along the first direction X and the second direction Y, and the second support layer 136 is in contact with two adjacent steps 114 along the first direction X.

It should be noted that in FIG. 7 and FIG. 8, the ladder structure 104 includes 12 steps 114, and the array arrangement of 3*4 is an example. In practical applications, the steps included in the ladder structure 104. The number of steps 114 is not limited, and there is no limit to the number of steps 114 arranged along the first direction X and the number arranged along the second direction Y. In addition, in FIG. 8, along the first direction X, the number of first support layer 126 is 2, and each first support layer 126 is connected with 4 steps 114 respectively, and the 4 steps 114 having a shape of 2*2 array arrangement is an example. In practical applications, there is no limit to the number of first support layer 126 arranged along the first direction X, and the steps 114 connected to each first support layer 126 with no quantity limit in.

Figure 9:
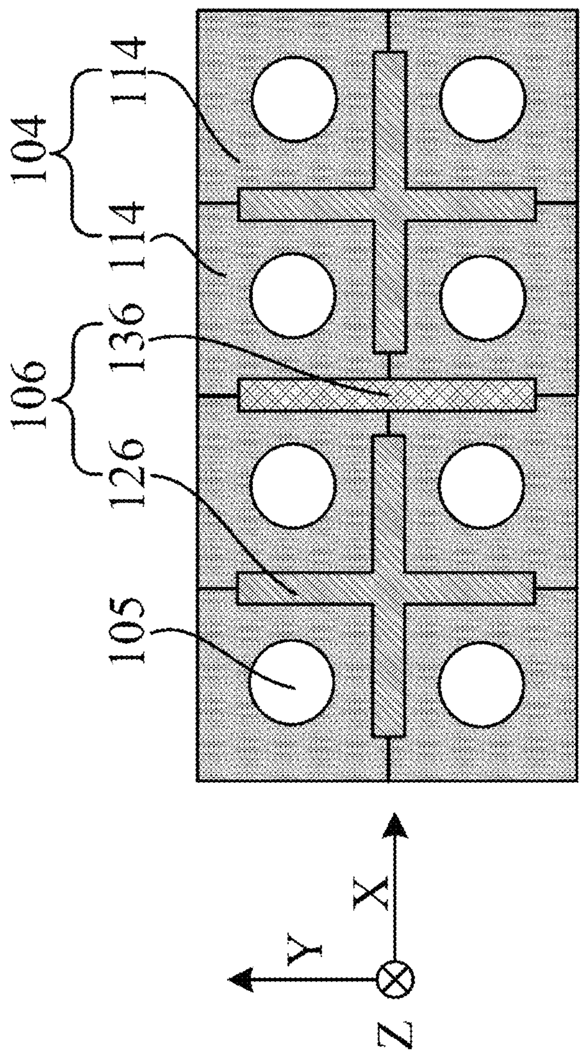

In some other embodiments, referring to FIG. 9, the step 114 is connected to the bit line 101 (see FIG. 2) one by one: the support frame 106 includes: a first support extending along the first direction X and the second direction Y Layer 126, the second support layer 136 located in the interval between adjacent first support layer 126; wherein, the first support layer 126 is in contact with 4 steps 114 arranged in an array, and the first support layer 126 is connected along the first direction X and/or the second direction Y are arranged at intervals, and the second support layer 136 is in contact with the four steps 114 arranged in an array.

It can be understood that the first support layer 126 has a cross-sectional shape along a plane perpendicular to the third direction Z, the second support layer 136 extends along the second direction Y, and the adjacent first support layer 126 and the second support layer 136 is in contact with the same two steps 114. For example, the two adjacent steps 114 in the second direction Y have opposite first sides and second sides in the first direction X. The first support layer 126 is on the first side and the second support layer 136 is on the second side.

It should be noted that in practical applications, the step 114 can be connected to the word line 103 one by one. After the exchange of the first direction X and the third direction Z in FIGS. 6-9, the support frame 106 is suitable for the case where the steps 114 are in a one-to-one contact with the word line 103.

Figure 10:
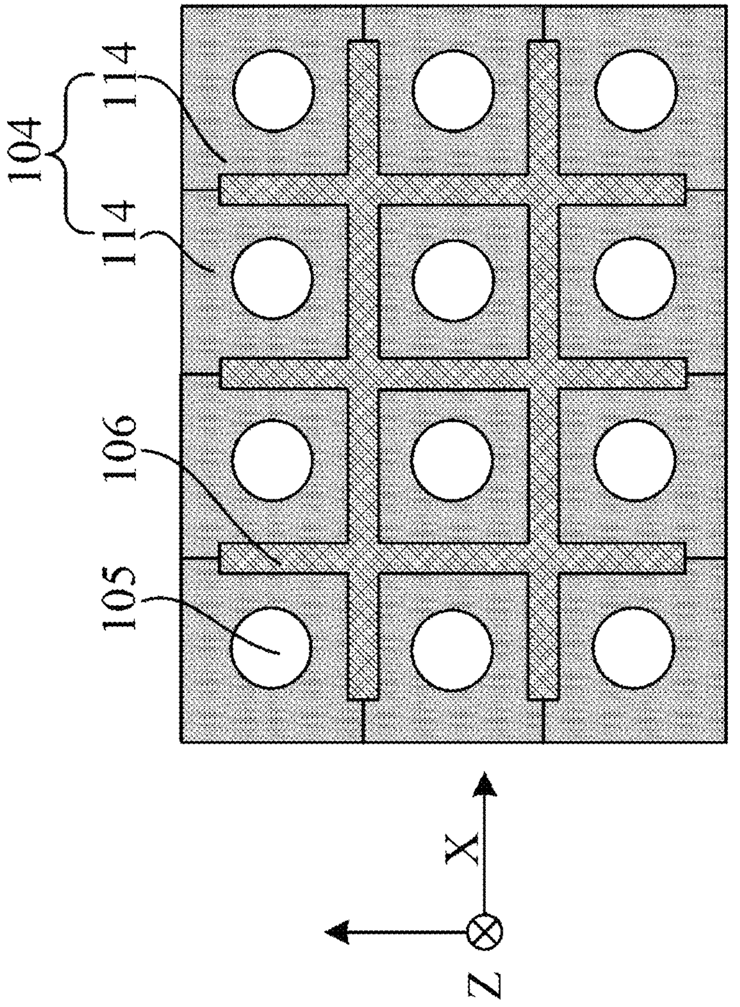

In still some embodiments, referring to FIG. 10, the support frame 106 is a grid-like structure, the grid-like structure has a plurality of spaces, and the steps 114 are located in the spaces and correspond to the spaces one by one.

It should be noted that the specific structure of the support frame 106 provided by an embodiment of the present disclosure includes but is not limited to the five examples shown in FIG. 6 to FIG. 10 and the support structure connected to each step 114 can be used as the support frame 106.

In the above embodiments, the material of the support frame 106 includes at least one of silicon nitride or silicon oxynitride.

In some embodiments, referring to FIG. 1 and FIG. 2, the peripheral region 120 includes a spacer 130 between the ladder structure 104 and the array region 110, the bit line 101 or the word line 103 is also located in the spacer 130, the semiconductor structure It further includes: a peripheral protection layer 107. the peripheral protection layer 107 is located on the spacer 130 and surrounds the sidewall of the bit line 101 or the word line 103 extending along the first direction X of the spacer 130. In this way, the electrical insulation between the ladder structure 104 and the memory cells in the array region 110 can be realized by using the peripheral protection layer 107, and the electrical interference between the ladder structure 104 and the storage memory cells in the array region 110 can be reduced. Moreover, when preparing the ladder structure 104. which is beneficial to avoid the influence of the fabrication process on the array region 110.

It should be noted that in FIG. 1 and FIG. 2, the bit line 101 is still located in the spacer 130, and the peripheral protection layer 107 surrounds the sidewall of the bit line 101 extending along the first direction X in the spacer 130 as an example. In this case, the word line 103 may be located in the spacer region 130. and the peripheral protection layer 107 surrounds the sidewall of the word line 103 extending along the first direction X in the spacer region 130.

In some embodiments, referring to FIG. 1 and FIG. 2, the peripheral protective layer 107 surrounds the sidewalls of the ladder structure 104 extending along the extending direction of the conductive column 105, and there is a gap between part of the peripheral protective layer 107 and the ladder structure 104. interval. In this way, it is beneficial to position the ladder structure 104 through the peripheral protection layer 107, and improve the overall protection effect of the ladder structure 104, and when preparing the ladder structure 104, it is beneficial to avoid the preparation process from affecting the other areas of the array region 110 and the peripheral region 120.

It can be understood that there may be a dielectric layer in the space between the peripheral protective layer 107 and the ladder structure 104.

In some embodiments, referring to FIG. 1 and FIG. 2. there is an isolation layer 117 between the peripheral protective layer 107 and the ladder structure 104, which is beneficial to improve the overall stability of the semiconductor structure. In one example, the material of the isolation layer 117 may be silicon oxide.

In some embodiments, the material of the peripheral protective layer 107 is the same as the material of the support frame 106. In this way, it is beneficial to jointly support the semiconductor structure, so as to improve the overall stability of the semiconductor structure.

To sum up, the word line 103 or the bit line 101 of the array area 110 is led out to the peripheral region 120 by using the ladder structure 104 to connect to the peripheral control circuit. Wherein, the steps 114 in the ladder structure 104 are in one-to-one correspondence with the word lines 103, or the steps 114 in the ladder structure 104 are in one-to-one contact connection with the bit lines 101, so that the word lines 103 or the bit lines 101 are led out through the steps 114: Further, the conductive columns 105 are connected to the steps 114 one by one to further lead out the word line 103 or the bit line 101: moreover, the support frame 106 is located between any two adjacent conductive columns 105, and is connected to each step 114 contact connection, which is beneficial to use the support frame 106 to reduce the electrical interference between adjacent conductive columns 105, and reduce the electrical interference between adjacent steps 114, so as to realize independent control of each word line 103 or bit line 101. in addition, since the heights of the top surfaces between the steps 114 in the ladder structure 104 are not the same, that is, the irregularity of the ladder structure 104 itself is relatively high, the support frame 106 is conducive to improving the stability of the ladder structure 104, thereby helping to improve Stability of semiconductor structures.

Another embodiment of the present disclosure also provides a method for manufacturing a semiconductor structure, which is used to prepare the semiconductor structure provided by an embodiment of the present disclosure. A method for manufacturing a semiconductor structure provided by another embodiment of the present disclosure will be described in detail below with reference to FIGS. 1 to 20. FIG. 11 to FIG. 20 are structural schematic diagrams corresponding to each step of a manufacturing method of a semiconductor structure provided by another embodiment of the present disclosure.

It should be noted that, in order to facilitate the description and clearly illustrate the steps of the semiconductor structure manufacturing method, FIG. 11 to FIG. 20 in another embodiment of the present disclosure are partial structural schematic diagrams of the semiconductor structure.

Parts that are the same as or corresponding to the foregoing embodiments will not be repeated here.

Referring to FIGS. 1 to 20, the manufacturing method of the semiconductor structure includes: providing a substrate 100, the substrate 100 has an adjacent array region 110 and a peripheral region 120; forming a bit line 101 extending along the first direction X on the array region 110. A semiconductor channel 102 extending along the second direction Y and a word line 103 extending along the third direction Z, where the first direction X, the second direction Y and the third direction Z intersect two by two: a ladder structure 104 is formed on the peripheral region 120. The conductive column 105 and the support frame 106, wherein the ladder structure 104 includes a plurality of steps 114, and the steps 114 are in one-to-one contact connection with one of the bit line 101 and the word line 103; the conductive column 105 is in one-to-one contact connection with the steps 114. the extending direction of the conductive column 105 is the same as the extending direction of the other one of the bit line 101 and the word line 103: the support frame 106 is located between any two adjacent conductive columns 105, and is in contact with each step 114; along the extending direction of the conductive columns 105. the height of the top surface of any step 114 is different from that of the other step 114. and the adjacent steps 114 are electrically insulated.

It should be noted that, for the convenience of subsequent description, the ladder structure 104 is subsequently used to lead the bit line 101 to the peripheral region 120, the step 114 is connected to the bit line 101 one by one, and the extending direction of the conductive column 105 is consistent with the word The extending direction of the word line 103 is the same as an example for detailed description.

Figure 11:
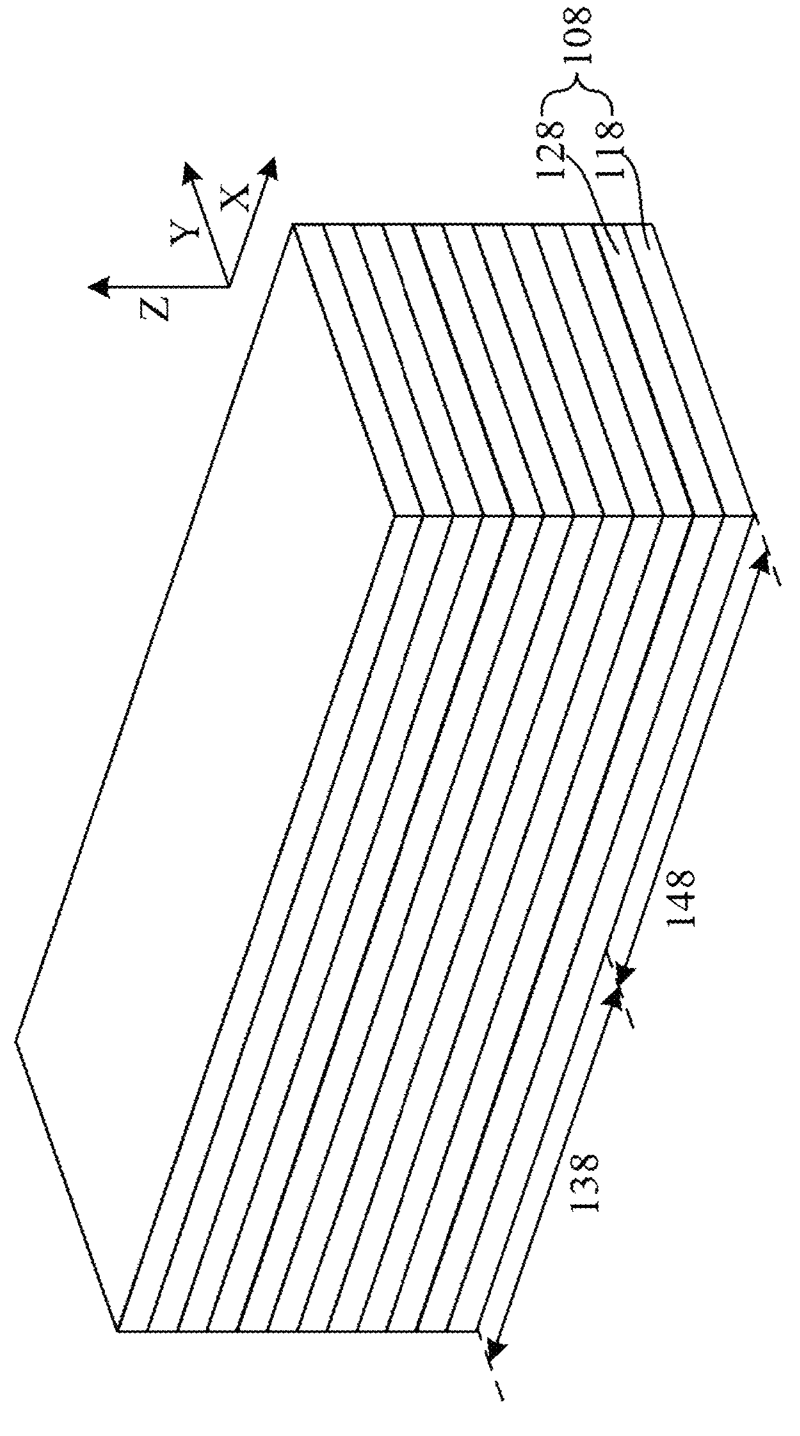
FIGS. 11 to 20 are structural schematic diagrams corresponding to each step of a manufacturing method of a semiconductor structure provided by another embodiment of the present disclosure.

In some embodiments, forming ladder structure 104 comprises the steps of:

Referring to FIG. 11. a multilayer initial stack structure 108 stacked along the extending direction of the conductive column 105 is formed on the peripheral region 120. Along the extending direction of the conductive column 105, that is, on the third direction Z, the initial stack structure 108 includes the first semiconductor layer 118 and the second semiconductor layer 128 are stacked. The initial stack structure 108 has a spacing region 138 close to the array region 110 (refer to FIG. 1) and a step region 148 on a side of the spacing region 138 away from the array region 110.

It should be noted that, the space where part of the first semiconductor layer 118 in the step region 148 is subsequently used to form the insulating layer 144 (refer to FIG. 1), and the space where part of the second semiconductor layer 128 is in the step region 148 Later, it will be used to form the steps 114 (refer to FIG. 1) to form the ladder structure 104 (refer to FIG. 1).

Figure 12:
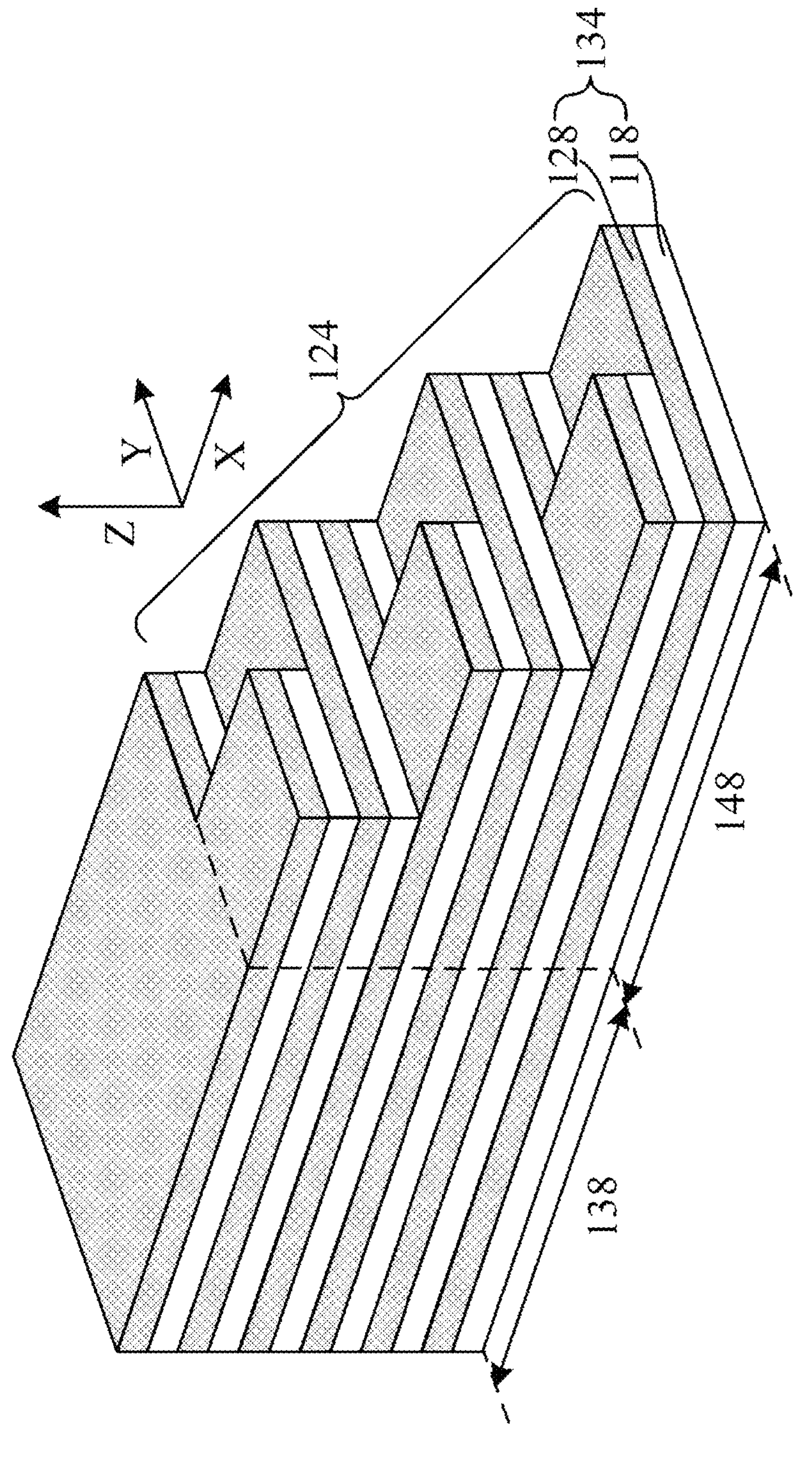

With reference to FIGS. 11 and 12, the initial stacked structure 108 of the step region 148 is subjected to a first patterning process to form an initial ladder structure 124. The initial ladder structure 124 includes a plurality of initial step structures 134 along the conductive column 105. In the extending direction of. the top surface height of any initial step structure 134 is different from the top surface height of another initial step structure 134.

It can be understood that the remaining first semiconductor layer 118 and the remaining second semiconductor layer 128 overlapped by orthographic projection on the substrate 100 (refer to FIG. 1) form an initial step structure 134. It can be understood that, the space where the first semiconductor layer 118 in the initial step structure 134 is subsequently used to form the insulating layer 144 (refer to FIG. 1), and the space where the second semiconductor layer 128 is located in the initial step structure 134 will be subsequently It will be used to form the steps 114 (refer to FIG. 1) to form the ladder structure 104 (refer to FIG. 1).

Referring to FIGS. 13 to 17, the initial ladder structure 124 is etched to form spaces in which the steps 114 are formed.

The steps of forming the step 114 will be described in detail below.

Figure 13:
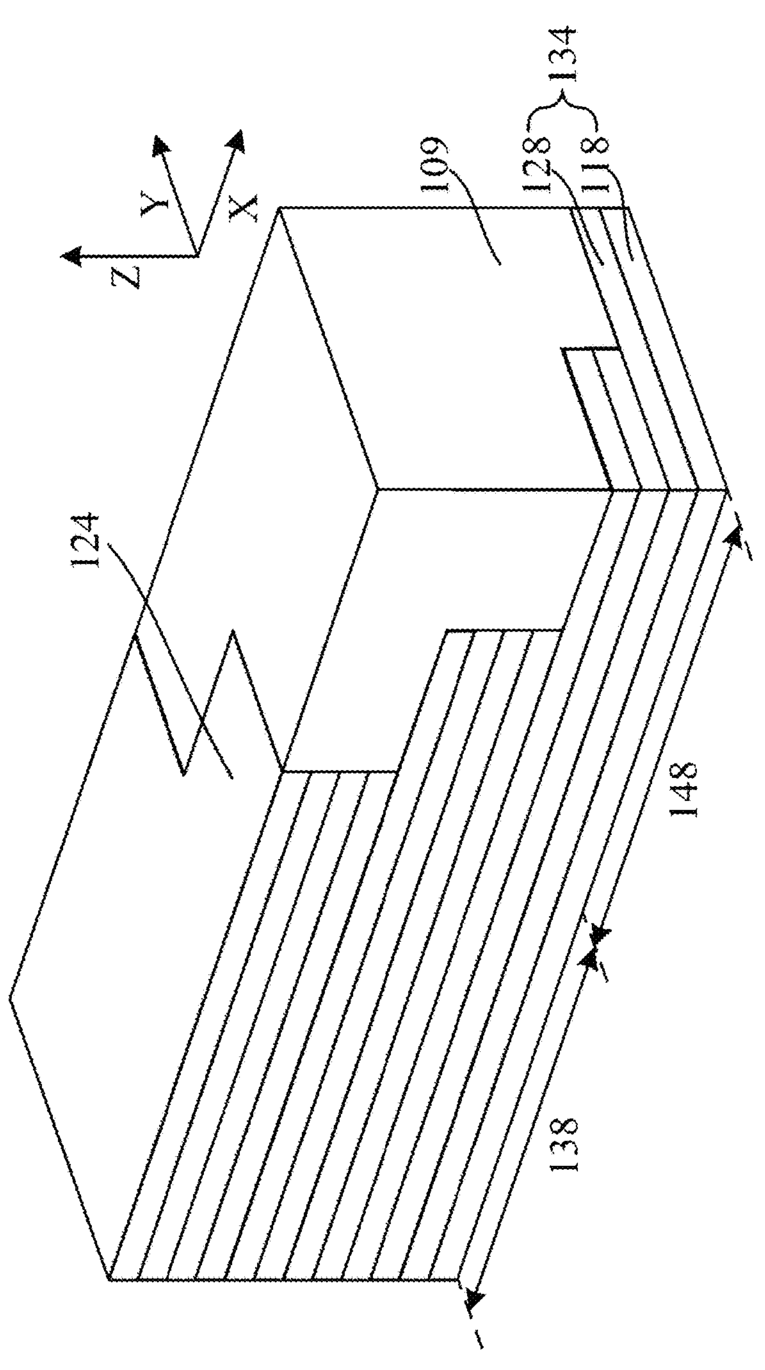

In some embodiments, after forming the initial ladder structure 124, before etching the initial ladder structure 124 to form the step 114, forming the support frame 106 may include the following steps: Referring to FIG. 13, a first dielectric layer 109 is formed. The first dielectric layer 109 is located on the top surface of each initial step structure 134. The top surface of the initial step structure 134 farthest from the substrate 100 is the reference top surface. The first top surface of the dielectric layer 109 away from the substrate 100 is flush with the reference top surface. It can be understood that the initial step structure 134 and the first dielectric layer 109 form a cuboid as a whole, which is beneficial to the subsequent formation of a ladder structure substrated on regular cuboids.

Figure 14:
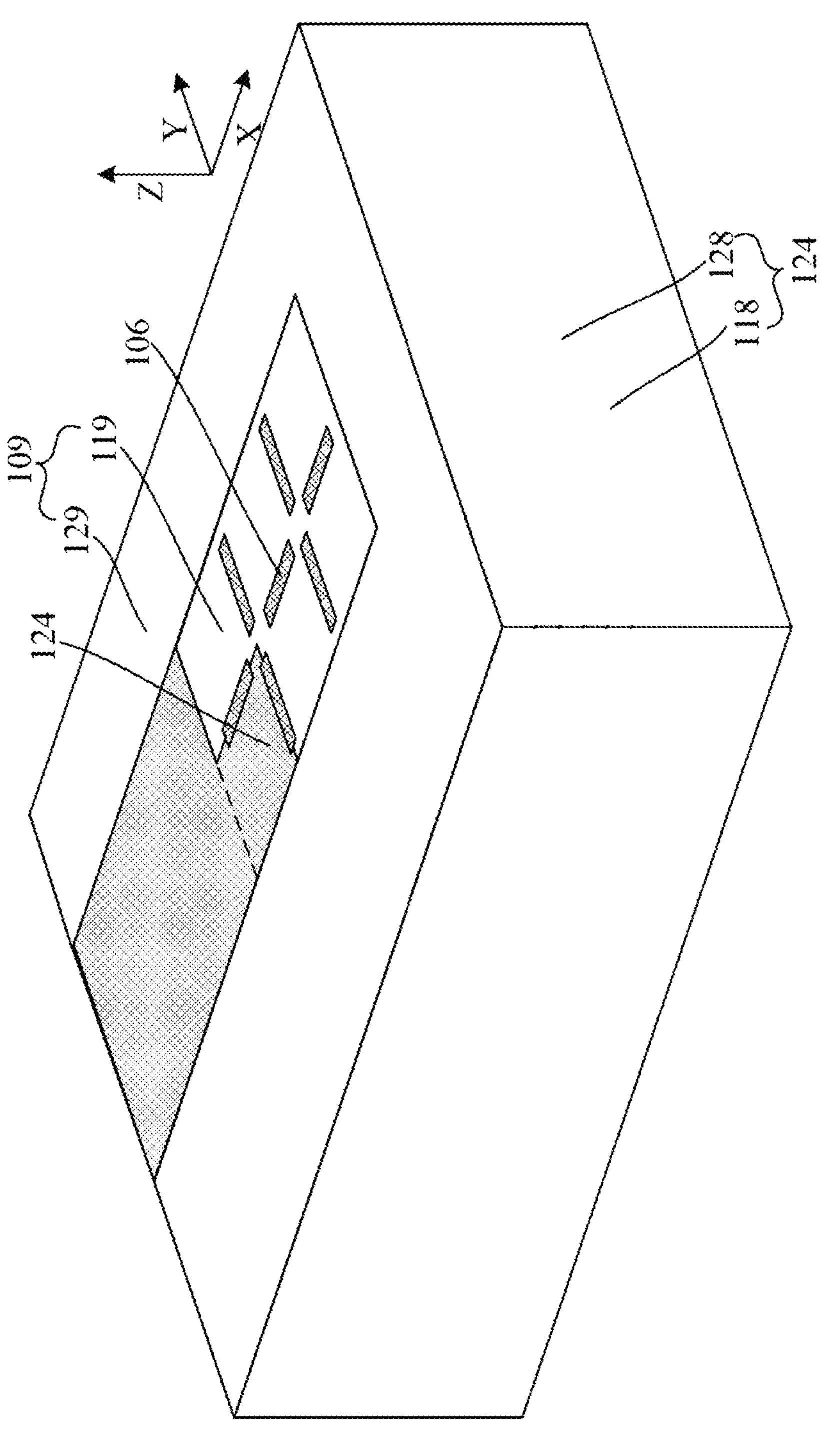

Referring to FIG. 14, the initial ladder structure 124 and the first dielectric layer 109 are subjected to a second patterning process to form a first groove (not shown in the figure): a support frame 106 that fills the first groove is formed.

It should be noted that along the extending direction of the conductive column 105, that is, in the third direction Z, the bottom surface of the first groove close to the substrate 100 is the third bottom surface, and the second bottom surface closest to the substrate 100 in the initial ladder structure 124 is the bottom surface of the semiconductor layer 128 close to the substrate 100 in the fourth bottom surface, and the third bottom surface is not higher than the fourth bottom surface. In this way, it is beneficial to form the first groove at least through most of the initial ladder structure 124, so that the support frame 106 can be contacted with each step 114, so as to improve the stability of the ladder structure 104 and reduce the distance between adjacent steps 114. electrical interference.

In addition, only one kind of first groove for preparing the support frame 106 is shown in FIG. 14 grooves to form the support frame 106 as described in any one of FIGS. 7 to 10.

In some embodiments, continuing to refer to FIG. 14. the first dielectric layer 109 is also located on opposite sides of the initial ladder structure 124 along the second direction Y. It can be understood that, in FIG. 14. the first dielectric layer 109 is located on the side of the initial ladder structure 124 away from the distance region 138. and FIG. 14 is located in the distance region 138 as an example. In addition, referring to FIG. 14. the first dielectric layer 109 includes a third dielectric layer 119 and a fourth dielectric layer 129, and the orthographic projection of the third dielectric layer 119 on the substrate 100 (refer to FIG. 1) is located on the substrate 100 with the initial ladder structure 124 In the orthographic projection of. the fourth dielectric layer 129 is located on opposite sides of the initial ladder structure 124 along the second direction Y and on a side of the initial ladder structure 124 away from the distance region 138.

It should be noted that, in some embodiments, the third dielectric layer 119 and the fourth dielectric layer 129 can be formed step by step, that is, the first dielectric layer 109 is a multi-layer structure: in other embodiments, the second three dielectric layers 119 and the fourth dielectric layer 129 can also be integrally formed, that is, the first dielectric layer 109 has a single-layer structure. The manufacturing method provided by another embodiment of the present disclosure has no limitation on how to form the first dielectric layer 109.

Figure 15:
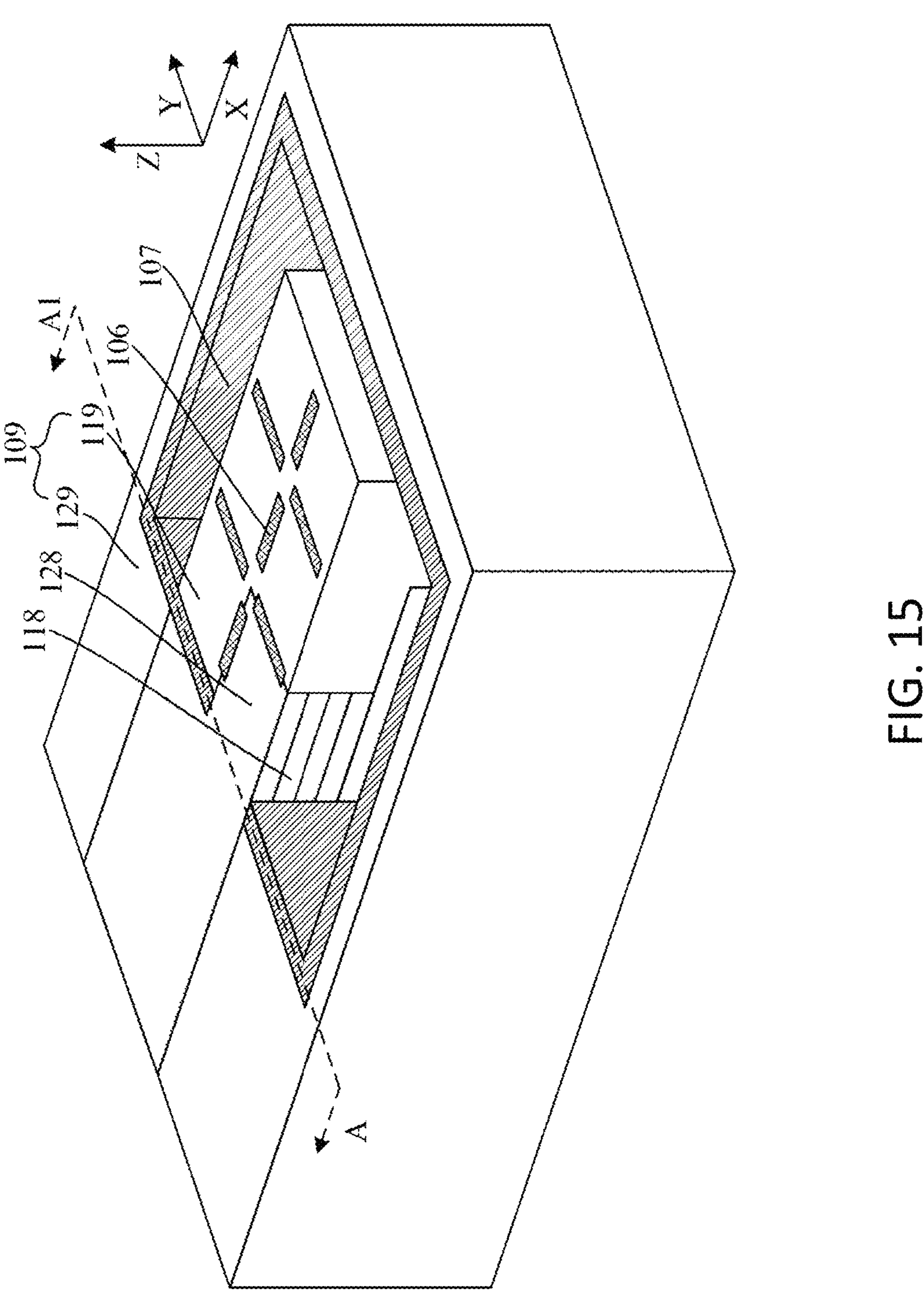
Figure 16:
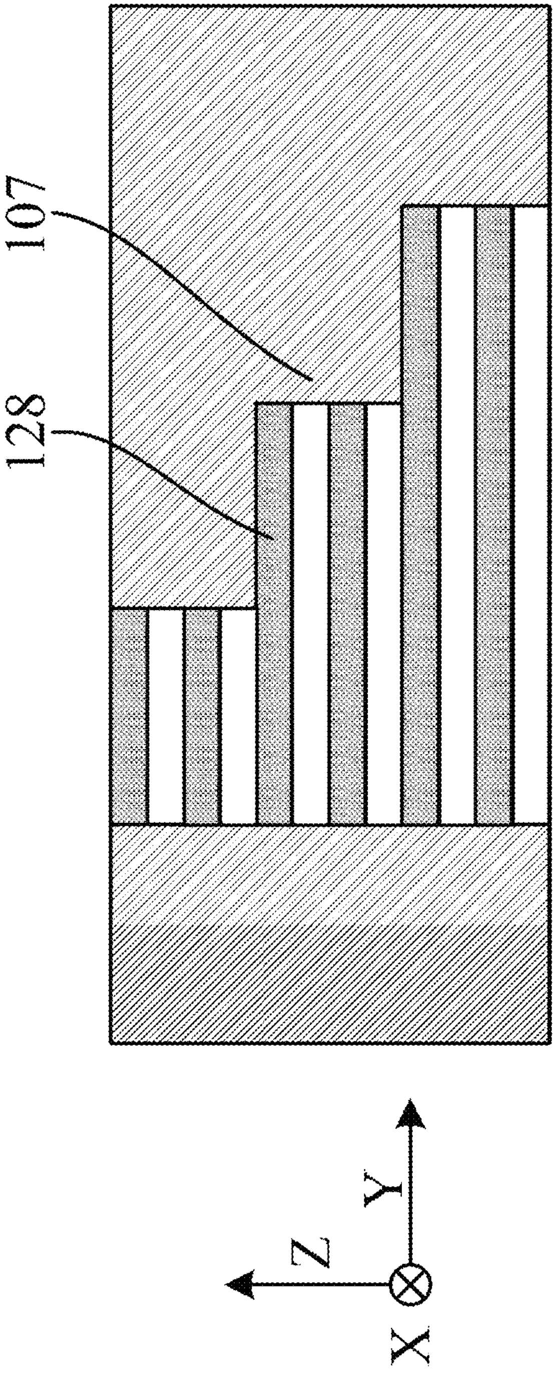

Referring to FIG. 14 to FIG. 16, after forming the initial ladder structure 124 and before etching the initial ladder structure 124 to form the step 114, the manufacturing method may further include: initial stacking structure 108 of the spacing region 138 (refer to FIG. 13) (refer to FIG. 11) and the first dielectric layer 109 are subjected to a third patterning process to form a second groove: and a peripheral protective layer 107 filling the second groove is formed.

Wherein, FIG. 16 is a partial cross-sectional structural schematic diagram of the structure shown in FIG. 15 along the cross-sectional direction AA1.

It should be noted that, with reference to FIG. 16. in the step of performing the third patterning process on the initial stacked structure 108 of the spacing region 138, the initial stacked structure 108 that is in contact with the step region 148 (refer to FIG. 13) will not be removed, so that the formed peripheral protection layer 107 surrounds the sidewalls extending along the first direction X of the initial ladder structure 124 (refer to FIG. 12). In addition, in practical applications, the third patterning treatment may only be performed on the first dielectric layer 109 to form the second grooves.

In some embodiments, the step of forming the second groove may further include: performing a third patterning process on the first dielectric layer 109 of the step region 148 (refer to FIG. 13), to form a pattern similar to that shown in FIG. 15. The second groove in the shape of a square ring forms a peripheral protection layer 107 similar to a shape of a square ring.

It should be noted that, in FIG. 15, the second groove is an example of a square ring shape. In practical applications, the second groove may only be located in the initial stacked structure 108 and the initial Between the ladder structures 124. It can be understood that, when the ladder structure is subsequently formed, the etching and deposition processes may be performed only on the initial ladder structure 124 surrounded by the outer protective layer 107 to avoid affecting the semiconductor structure in other regions.

In addition, in some embodiments, the first groove and the second groove can be formed through the same step, and the support frame 106 and the peripheral protective layer 107 can be formed through the same step, which is conducive to simplifying the preparation of the support frame 106 and the peripheral process steps of the protective layer 107, and reduce the cost of preparing the support frame 106 and the peripheral protective layer 107.

Figure 17:
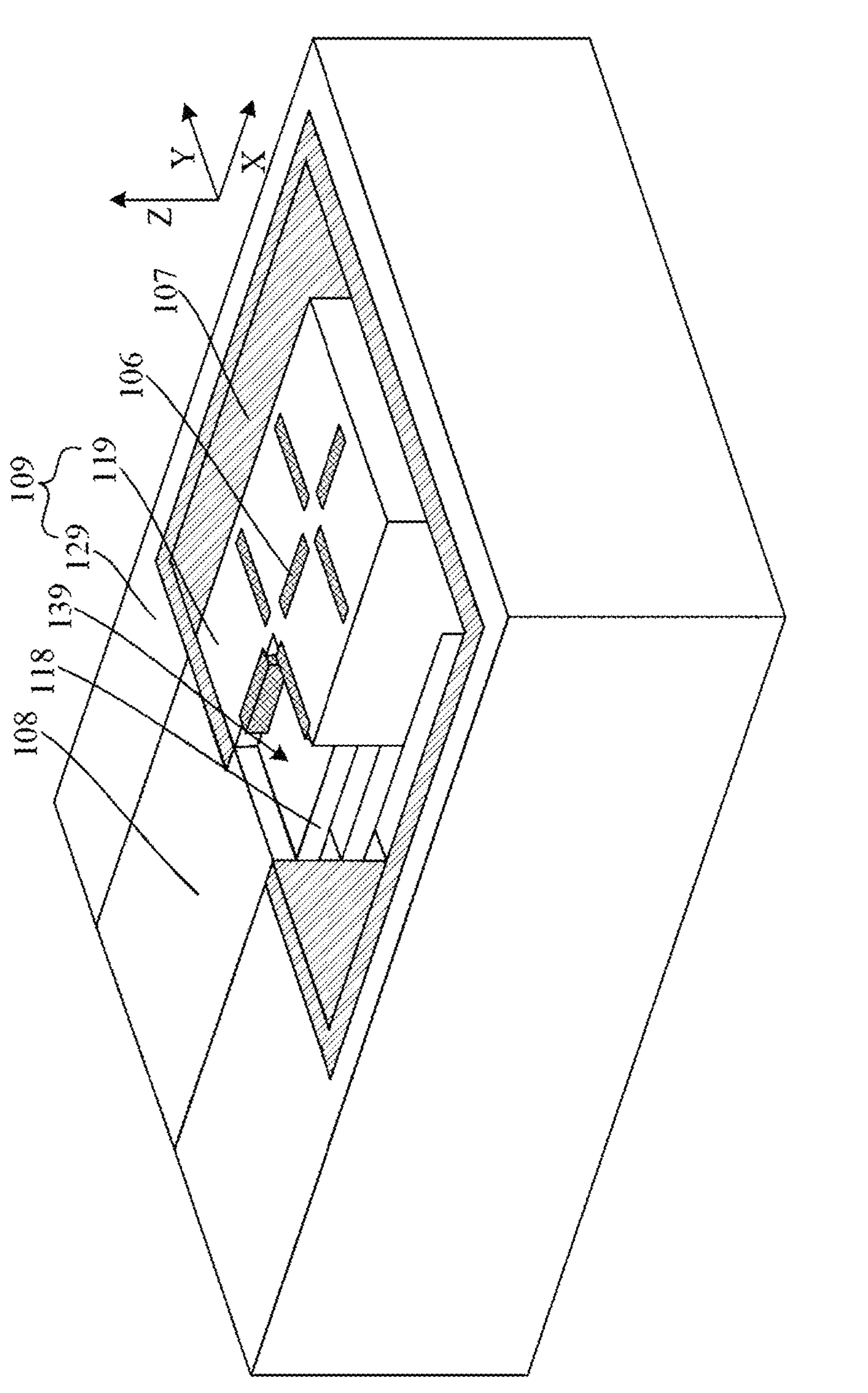

In some embodiments, referring to FIG. 15 to FIG. 17, after forming the peripheral protective layer 107, etching the initial ladder structure 124 to form the spacer 139 includes the following steps:

Referring to FIG. 15, the first dielectric layer 109 located between the initial ladder structure 124 and the peripheral protective layer 107 is removed to expose opposite sides of the initial ladder structure 124 along the second direction Y.

In some embodiments, the first dielectric layer 109 is also located on the side of the initial ladder structure 124 away from the spacing region 138 (refer to FIG. 13), and the first dielectric layer between the initial ladder structure 124 and the peripheral protective layer 107 is removed Layer 109 also exposes the side of the initial ladder structure 124 away from the spacing region 138.

With reference to FIG. 15 to FIG. 17. along the second direction Y, the second semiconductor layer 128 in the initial ladder structure 124 is etched to form the spacer 139. Since the support frame 106 is in contact with each first semiconductor layer 118, it is beneficial to support the remaining first semiconductor layer 118 through the support frame 106 in the step of etching the second semiconductor layer 128, avoiding the remaining first semiconductor layer 118. The layer 118 collapses under the influence of the etching process, which is beneficial to improve the dimensional accuracy of the formed ladder structure.

Figure 18:
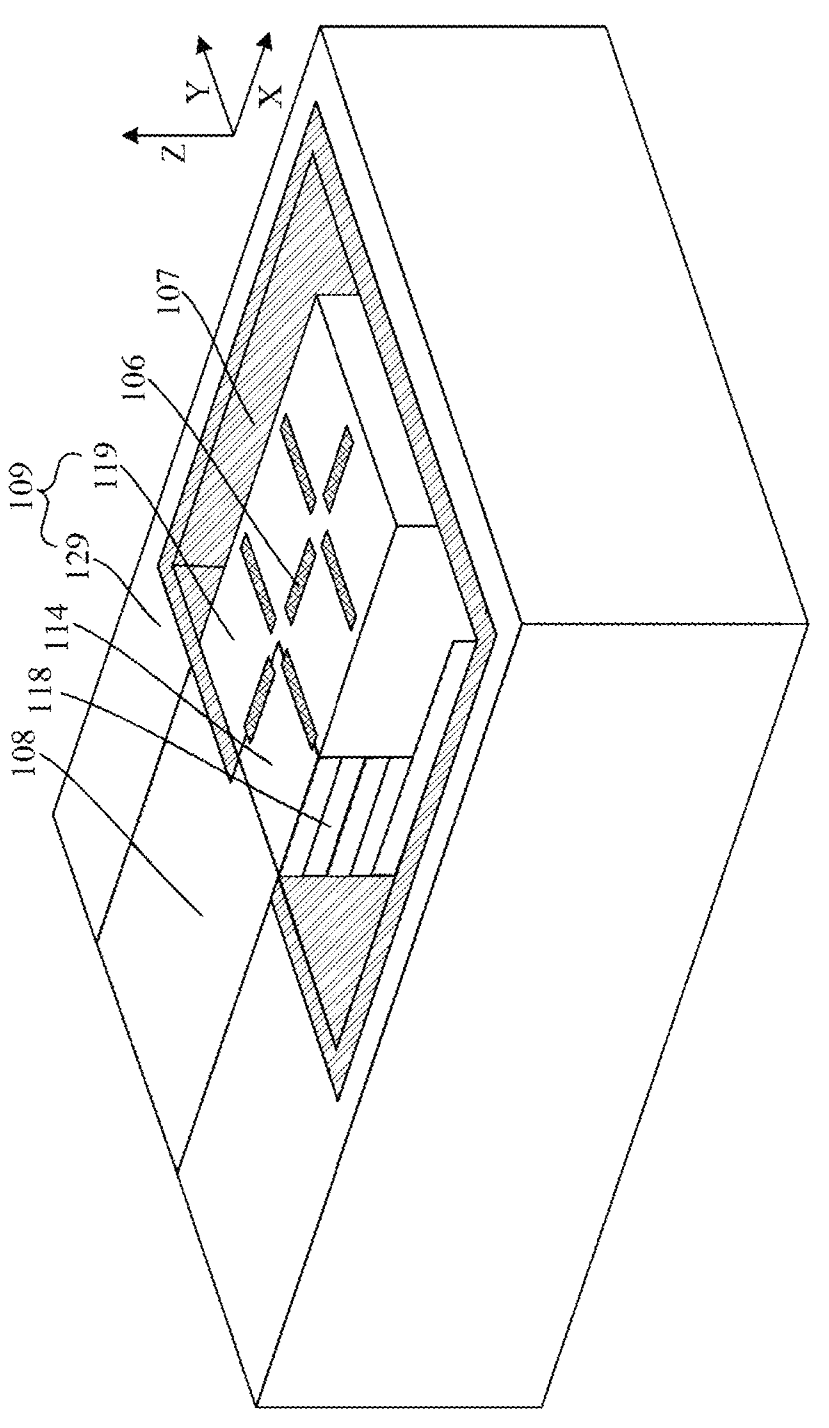

Referring to FIG. 18, the step 114 filling the spacer 139 is formed.

Figure 19:
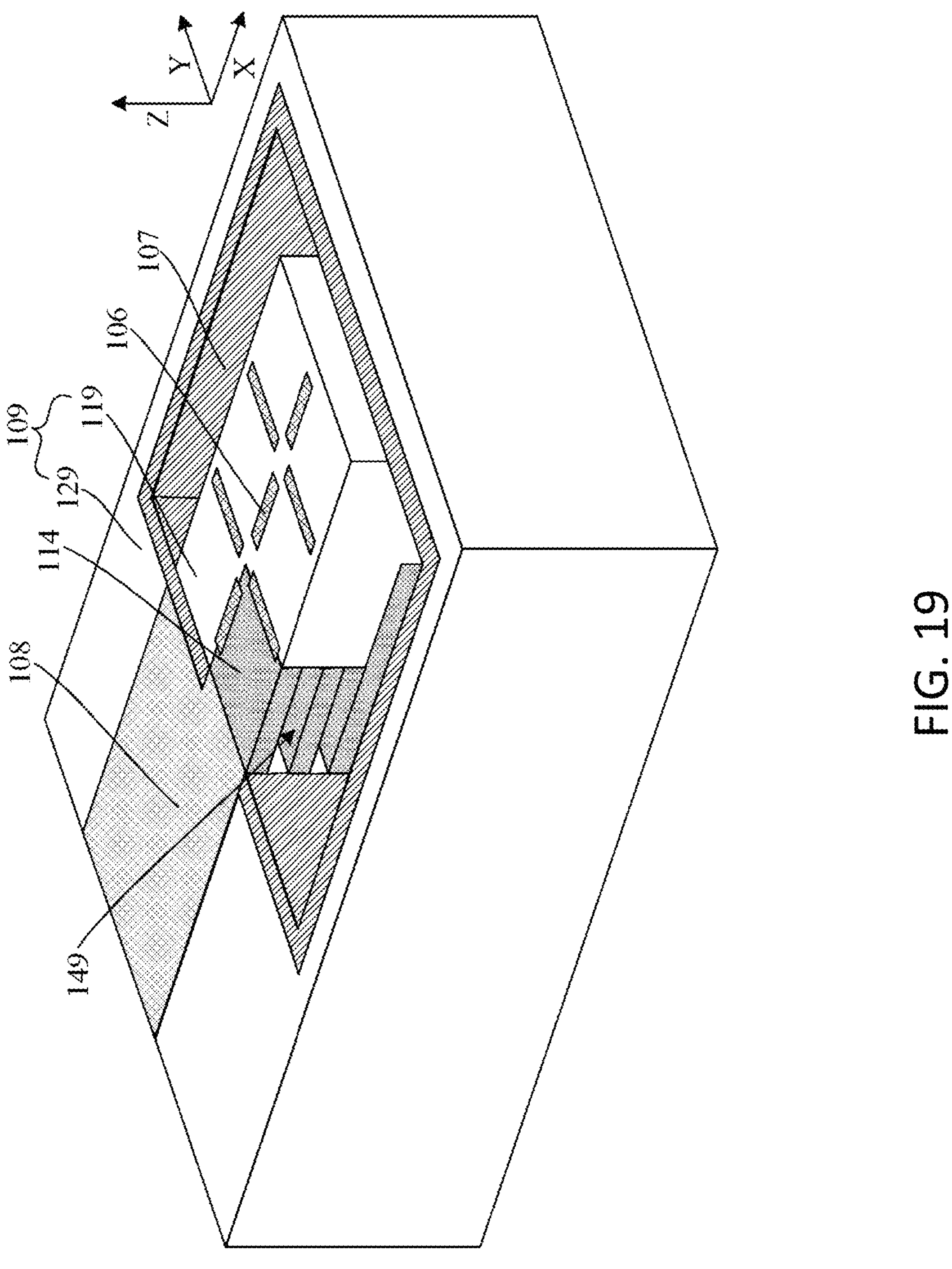

In some embodiments, after forming the step 114, the manufacturing method further includes the following steps:

Referring to FIG. 18 and FIG. 19 together, along the second direction Y, the first semiconductor layer 118 in the initial ladder structure 124 (refer to FIG. 14) is etched to form a gap 149. Since the support frame 106 is in contact with each step 114, in the step of etching the first semiconductor layer 118, it is beneficial to support the steps 114 by the support frame 106, so as to prevent the step 114 from collapsing due to the impact of the etching process. It is beneficial to improve the dimensional accuracy of the formed ladder structure.

Figure 20:
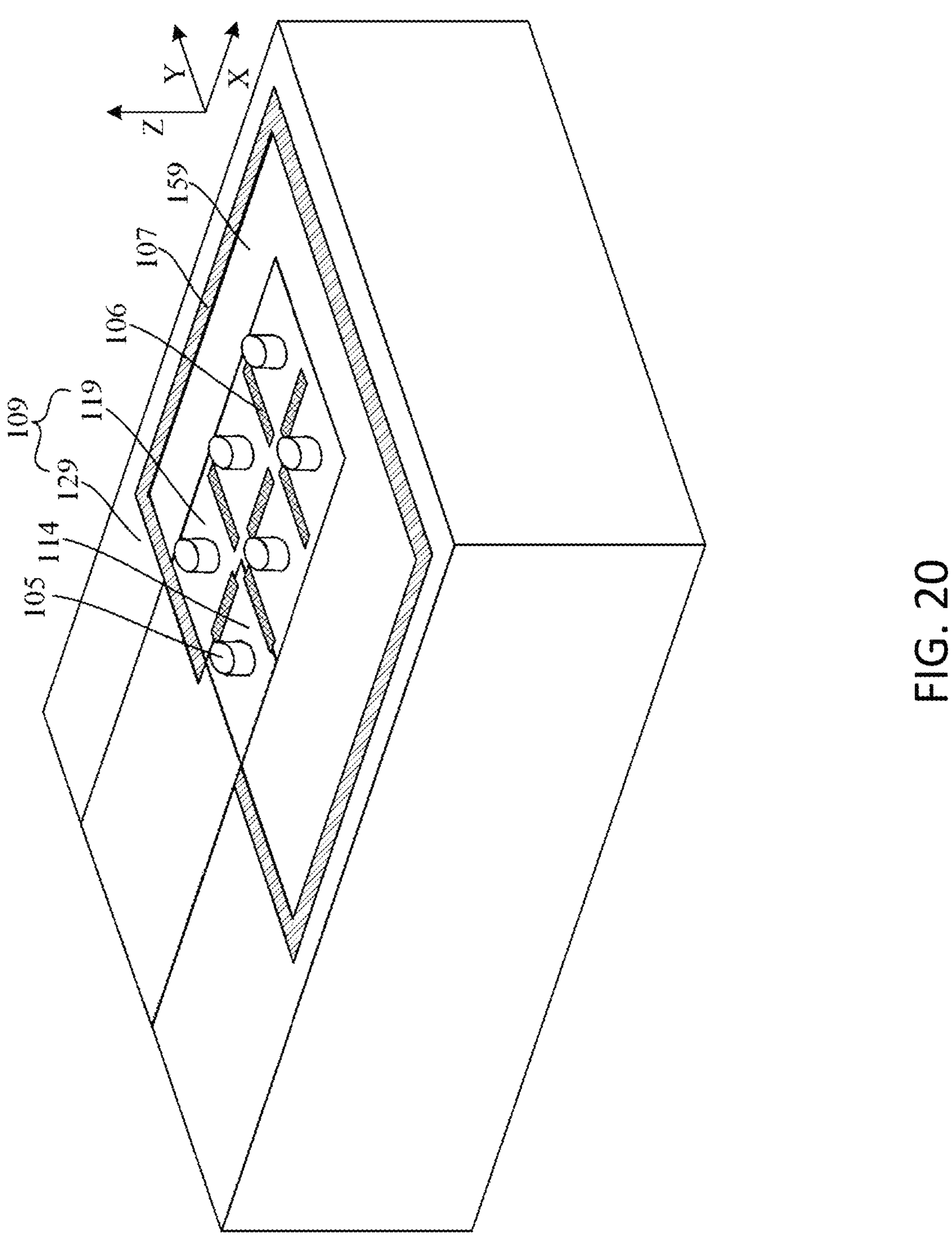

Referring to FIG. 19, FIG. 20 and FIG. 1, a second dielectric layer 159 is formed, and the second dielectric layer 159 fills the gap 149 and the space between the peripheral protection layer 107 and the ladder structure 104.

It can be understood that the second dielectric layer 159 filling the gap 149 is the insulating layer 144 (refer to FIG. 5), the remaining second dielectric layer 159 is located between the peripheral protective layer 107 and the ladder structure 104, and the remaining second dielectric layer 159 is the isolation layer 117.

Continuing to refer to FIG. 20, a fourth patterning treatment is performed on the third dielectric layer 119 to form a fourth groove, a fourth groove exposes a step 114: and a conductive column 105 filling the fourth groove is formed. In some embodiments, the top surface of the conductive column 105 away from the substrate 100 may be higher than the highest top surface of the ladder structure 104 away from the substrate 100.

In addition, in practical applications, the third dielectric layer 119 can be far away from the top surface of the substrate 100 and can be higher than the highest top surface of the ladder structure 104 away from the substrate 100, that is, the third dielectric layer 119 covers each step 114 away from the substrate 100. The top surface of each step 114 is subsequently exposed by forming a fourth groove.

It should be noted that, in order to illustrate the internal structure of the semiconductor structure, the fourth dielectric layer 129 is drawn in perspective in FIGS. 14 to 19.

To sum up, in the manufacturing method provided by another embodiment of the present disclosure, in the step of forming the ladder structure 104, the support frame 106 is beneficial to avoid the impact of the etching process on the structure that does not need to be etched, and avoid unnecessary etching caused structure collapses, thereby improving the dimensional accuracy of the formed ladder structure 104. Moreover, the peripheral protection layer 107 is beneficial to avoid damage to other regions of the semiconductor structure caused by the process of forming the ladder structure 104. also. In the semiconductor structure formed by the manufacturing method provided in another embodiment of the present disclosure, the support frame 106 is located between any two adjacent conductive columns 105 and is in contact with each step 114. so that the use of the support frame 106 is beneficial to reduce phase electrical interference between adjacent conductive columns 105, and reduce electrical interference between adjacent steps 114, so as to realize independent control of each word line 103 or bit line 101, in addition, due to the heights of the top surfaces are different, that is, the irregularity of the ladder structure 104 itself is relatively high, and the support frame 106 is conducive to improving the stability of the ladder structure 104, thereby improving the stability of the semiconductor structure.

Those of ordinary skill in the art can understand that each of the above-described implementation modes is a specific embodiment for realizing the disclosure, and in practical applications, various changes can be made to it in form and details without departing from the disclosure spirit and scope of the embodiments. Any person skilled in the art can make various changes and modifications without departing from the spirit and scope of the embodiments of the present disclosure. Therefore, the protective scope of the embodiments of the present disclosure should be based on the scope defined in the claims.

The invention claimed is:

1. A semiconductor structure, comprising:

a substrate, wherein the substrate comprises an array region located adjacently, and a peripheral region;

a bit line extending along a first direction, a semiconductor channel extending along a second direction and a word line extending along a third direction, wherein the bit line, the semiconductor channel and the word line are all located in the array region, wherein two of the first direction, the second direction and the third direction intersect each other;

a ladder structure located in the peripheral region, wherein the ladder structure comprises a plurality of steps, wherein each of the plurality of steps is contact-connected to one of the bit line and the word line;

a plurality of conductive columns, wherein each of the plurality of conductive columns is connected to a top surface of one of the plurality of steps, wherein an extending direction of the plurality of conductive columns is a same as the extending direction of another of the bit line and the word line; and a support frame, wherein the support frame is located between two adjacent ones of the plurality of conductive columns, and wherein the support frame is in contact with each of the plurality of steps;

wherein, along the extending direction of the plurality of conductive columns, a height of the top surface of one of the plurality of steps is different from a top surface of another one of the plurality of steps, and wherein two adjacent ones of the plurality of steps are electrically insulated;

wherein the plurality of steps is arranged in an array in a plane of the first direction and the second direction;

wherein, along the direction in which the array region points to the peripheral region, top surface heights of ones of the plurality of steps arranged at intervals along the first direction gradually decrease, and top surface heights of ones of the plurality of steps arranged at intervals along the second direction also gradually decrease.

2. The semiconductor structure according to claim 1, further comprising, along the extension direction of the plurality of conductive columns, a first top surface, which is a top surface of the support frame away from the substrate, a second top surface, which is a top surface of a step in the plurality of steps farthest from the substrate, wherein the first top surface is not lower than the second top surface, wherein a bottom surface of the support frame close to the substrate is a first bottom surface, and a bottom surface of one of the plurality of steps closest to the substrate is a second bottom surface, and wherein the first bottom surface is not higher than the second bottom surface.

3. The semiconductor structure according to claim 1, wherein the support frame comprises support layers, wherein each of the support layers and at least two of the plurality of steps are in contact connection, and wherein the plurality of steps is respectively located on opposite sides of each of the support layers along the first direction and/or on opposite sides of each of the support layers in the second direction.

4. The semiconductor structure according to claim 3, wherein one of the plurality of steps is contact-connected to the bit line in an one-to-one correspondence; wherein the support frame comprises: a first support layer arranged at intervals and extending in one of the first direction and the second directions, and a second support layer arranged at intervals along another one of the first direction (and the second direction, and wherein, the second support layer is located in an interval between two adjacent first support layers.

5. The semiconductor structure according to claim 4, wherein the extension direction of the first support layer is a reference direction, wherein the plurality of steps arranged at intervals along the reference direction is all contact-connected with the first support layer.

6. The semiconductor structure according to claim 4, wherein the extension direction of the first support layer is a reference direction, wherein multiples of the first support layers are arranged at intervals along the reference direction, wherein multiples of the plurality of steps arranged at intervals along the reference direction are in contact with multiples of the plurality of first support layers respectively.

7. The semiconductor structure according to claim 3, wherein one of the plurality of steps is contact connected to the bit lines in an one-to-one correspondence; wherein the support frame comprises: the first support layer, extending along the first direction and the second direction, and the second support layer, located in an interval between two adjacent first support layers;

wherein, the first support layer is in contact with four steps of the plurality of steps arranged in an array, and wherein the first support layer is arranged at intervals along the first direction and/or the second direction, and wherein the second support layer is arranged in contact connection with four steps of the plurality of steps arranged in an array.

8. The semiconductor structure according to claim 1, wherein the support frame is a grid-like structure, wherein the grid-like structure comprises a plurality of spaces, wherein the plurality of steps is located in the plurality of spaces corresponding to the plurality of spaces in an one by one correspondence.

9. The semiconductor structure according to claim 1, wherein a material of the support frame comprises at least one of silicon nitride or silicon oxynitride.

10. The semiconductor structure according to claim 1, wherein the peripheral region comprises a spacer region between the ladder structure and the array region, wherein the bit line or the word line is also located in the spacer region; and wherein the semiconductor structure further comprises: a peripheral protection layer, wherein the peripheral protection layer is located in the spacer region and surrounds a sidewall of the bit line or a sidewall of the word line extending along the first direction in the spacer region.

11. The semiconductor structure according to claim 10, wherein the peripheral protective layer surrounds a sidewall of the ladder structure extending along the extending direction of the conductive columns, and wherein an interval is located between part of the peripheral protective layer and the ladder structure.

12. The semiconductor structure according to claim 10, wherein a material of the peripheral protective layer is a same as a material of the support frame.

13. A method of fabricating a semiconductor structure, comprising:

providing a substrate having an adjacent array region and a peripheral region;

forming bit lines in the array region extending along a first direction, semiconductor channels extending along a second direction, and word lines extending along a third direction, wherein two of the first direction, the second direction and the third direction intersect each other; and forming a ladder structure, conductive columns and a support frame in the peripheral region, wherein the ladder structure comprises a plurality of steps, wherein the plurality of steps is in one-to-one contact connection with one of the bit lines and the word line; wherein each of the conductive columns is in one-to-one contact connection with each of the plurality of steps, and wherein the conductive columns extends in a same direction as another one of the bit lines and the word line;

wherein the support frame is located on any adjacent two conductive columns, and is in contact with each of the plurality of steps;

wherein along the extension direction of the conductive columns, a height of a top surface of one of the plurality of steps is different from a height of a top surface of another one of the plurality of steps, and wherein adjacent ones of the plurality of steps are electrically insulated from each other;

wherein forming the ladder structure comprises:

forming an initial stack structure having multi-layers arranged along the extension direction of the conductive columns in the peripheral region, wherein along the extension direction of the conductive columns, the initial stack structure comprises a first semiconductor layer and a second semiconductor layer stacked together, wherein the initial stack structure has a pitch region close to the array region and a step region located at on a side of the pitch region away from the array region;

performing a first patterning process on the initial stacked structure of the step region to form initial ladder structures, wherein the initial ladder structures comprise a plurality of initial step structures, wherein along the extending direction of the conductive columns a height of a top surface of one of the initial step structures is different from a height of a top surface of another initial step structure; and etching an initial ladder structure to form spaces in which the plurality of steps are formed.

14. The manufacturing method according to claim 13, wherein, after forming the initial ladder structure, before etching the initial ladder structure to form the plurality of steps, forming the support frame comprises:

forming a first dielectric layer, wherein the first dielectric layer is located on a top surface of each of the initial step structures, wherein the initial step structure farthest from the substrate is a reference top surface, and wherein a top surface of the first dielectric layer away from the substrate is flush with the reference top surface; and performing a second patterning process on the initial ladder structure and the first dielectric layer to form a first groove; and forming the support frame to fill the first groove.

15. The manufacturing method according to claim 14, wherein the first dielectric layer is also located on opposite sides of the initial ladder structure along the second direction;

after forming the initial ladder structure, before etching the initial ladder structure, forming the plurality of steps further comprising:

performing a third patterning process on the initial stack structure and the first dielectric layer of the spacing region, to form a second groove; and forming a peripheral protective layer to fill the second groove.

16. The manufacturing method according to claim 15, wherein, after forming the peripheral protection layer, said etching the initial ladder structure to form a spacer comprises:

removing the first dielectric layer between the initial ladder structure and the peripheral protective layer, to expose the initial ladder structure along the second direction on opposite sides;

etching the second semiconductor layer in the initial ladder structure along the second direction to form the spacer; and forming the plurality of steps to fill the spacer.

17. The manufacturing method according to claim 16, wherein, after forming the plurality of steps, further comprising:

etching the first semiconductor layer in the initial ladder structure along the second direction to form a gap; and forming a second dielectric layer, wherein the second dielectric layer fills the gap, and a space between the peripheral protective layer and the ladder structure.

* * * * *